United States Patent
Kang et al.

(10) Patent No.: US 11,479,844 B2
(45) Date of Patent: Oct. 25, 2022

(54) FLEXIBLE SUBSTRATE HAVING A PLASMONIC PARTICLE SURFACE COATING AND METHOD OF MAKING THE SAME

(71) Applicant: 3M INNOVATIVE PROPERTIES COMPANY, St. Paul, MN (US)

(72) Inventors: Myungchan Kang, Woodbury, MN (US); Evan Koon Lun Yuuji Hajime, Woodbury, MN (US); Douglas L. Elmore, Plymouth, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 98 days.

(21) Appl. No.: 16/470,923

(22) PCT Filed: Dec. 12, 2017

(86) PCT No.: PCT/US2017/065735
§ 371 (c)(1),
(2) Date: Jun. 18, 2019

(87) PCT Pub. No.: WO2018/118511
PCT Pub. Date: Jun. 28, 2018

(65) Prior Publication Data
US 2020/0087775 A1    Mar. 19, 2020

Related U.S. Application Data

(60) Provisional application No. 62/436,072, filed on Dec. 19, 2016.

(51) Int. Cl.
*C23C 14/02*    (2006.01)
*C23C 14/20*    (2006.01)
(Continued)

(52) U.S. Cl.
CPC ............ *C23C 14/024* (2013.01); *B29C 61/02* (2013.01); *B29C 71/02* (2013.01); *C08J 7/043* (2020.01);
(Continued)

(58) Field of Classification Search
CPC ....... C23C 14/024; C23C 14/20; C23C 14/30; B29C 61/02; B29C 71/02; B29C 71/0072;
(Continued)

(56) References Cited

U.S. PATENT DOCUMENTS 8,685,124 B2    4/2014 David
8,771,801 B2    7/2014 Moren
(Continued)

FOREIGN PATENT DOCUMENTS

KR    2016-0028564       3/2016
WO    WO 2016/031140 A1  3/2016
WO    WO 2017-007750     1/2017

OTHER PUBLICATIONS

Autumn, "Adhesive force of a single gecko foot-hair", Nature, Jun. 8, 2000, vol. 405, pp. 681-684.
(Continued)

*Primary Examiner* — Nathan L Van Sell

(57) ABSTRACT

Article comprising a polymeric substrate having a first major surface comprising a plurality of particles attached thereto with plasmonic material on the particles. Articles described herein are useful, for example, for indicating the presence, or even the quantity, of an analyte.

13 Claims, 6 Drawing Sheets

(51) Int. Cl.
| | |
|---|---|
| C23C 14/30 | (2006.01) |
| G01N 21/65 | (2006.01) |
| C08J 7/043 | (2020.01) |
| B29C 71/02 | (2006.01) |
| B29C 61/02 | (2006.01) |
| C09J 5/00 | (2006.01) |

(52) U.S. Cl.
 CPC ............... *C09J 5/00* (2013.01); *C23C 14/20* (2013.01); *C23C 14/30* (2013.01); *G01N 21/658* (2013.01)

(58) Field of Classification Search
 CPC . C08J 7/043; C08J 2323/06; C08J 7/06; C09J 5/00; G01N 21/658
 See application file for complete search history.

(56) References Cited

U.S. PATENT DOCUMENTS

| | | | |
|---|---|---|---|
| 2006/0148104 A1* | 7/2006 | Marini | G01N 33/542 436/524 |
| 2011/0192996 A1 | 8/2011 | Hahn | |
| 2014/0249526 A1 | 9/2014 | Kotov | |

OTHER PUBLICATIONS

Baker, "Progress in Plasmonic Engineering of Surface-Enhanced Raman-Scattering Substrates Toward Ultra-trace Analysis", Analytical and Bioanalytical Chemistry, 2005, vol. 382, pp. 1751-1770.

Chang, "Fast Oriented Bounding Box Optimization on the Rotation Group SO(3,R)", ACM Transactions on Graphics, Oct. 2011, vol. 30, No. 5, pp. 1-16.

Gunnarsson, "Interparticle Coupling Effects in Nanofabricated Substrates for Surface-Enhanced Raman Scattering", Applied Physics Letters, 2001, vol. 78, pp. 802-804.

Haes, "Plasmonic Materials for Surface-Enhanced Sensing and Spectroscopy", MRS Bulletin, May 2005, vol. 30, No. 5, pp. 368-375.

Huang, "Room-Temperature Ultraviolet Nanowire Nanolasers", Science, Jun. 8, 2001, vol. 292, No. 5523, pp. 1897-1899.

Hulteen, "A general Template-Based Method for the Preparation of Nanomaterials", Journal of Materials Chemistry, 1997, vol. 7, No. 7, pp. 1075-1087.

Millyard, "Stretch-Induced Plasmonic Anisotropy of Self-Assembled Gold Nanoparticle Mats", Applied Physics Letters, 2012, vol. 100, No. 7, pp. 073101-1-3, XP012165925.

Mizuno, "A black body absorber from vertically aligned single-walled carbon nanotubes", PNAS, Apr. 14, 2009, vol. 16, No. 15, pp. 6044-6047.

Uetani, "Elastomeric Thermal Interface Materials with High Through-Plane Thermal Conductivity from Carbon Fiber Fillers Vertically Aligned by Electrostatic Flocking", Advanced Materials, 2014, vol. 26, pp. 5857-5862.

Wang, "Strain-Tunable Plasmonic Crystal Using Elevated Nanodisks With Polarization-Dependent Characteristics", Applied Physics Letters, 2016, vol. 108, No. 7, pp. 071110-1-5, XP012205167_.

Worsfold, "Review of the explosibility of Nontraditional Dusts", I&EC research, AC Publications, 2012, vol. 51, pp. 7651-7655.

Zhang, "Surface Modification Studies of Edge-Oriented Molybdenum Sulfide Nanosheets", Langmuir, 2004, vol. 20, pp. 6914-6920.

International Search Report for PCT International Application No. PCT/US2017/065735, dated Apr. 6, 2018, 5pgs.

* cited by examiner

FLEXIBLE SUBSTRATE HAVING A PLASMONIC PARTICLE SURFACE COATING AND METHOD OF MAKING THE SAME

CROSS REFERENCE TO RELATED APPLICATIONS

This application is a national stage filing under 35 U.S.C. 371 of PCT/US2017/065735, filed Dec. 12, 2017, which claims the benefit of U.S. Application No. 62/436,072, filed Dec. 19, 2016, the disclosure of which is incorporated by reference in its/their entirety herein.

BACKGROUND

The alignment or orientation of particle assemblies is a commonly desired construction for the collective properties they may impart, and many embodiments of aligned or oriented particle assemblies are known. For example, arrays of self-organized, <0001> oriented zinc oxide nanowires exhibit room-temperature ultraviolet lasing are reported, for example, in "Room-Temperature Ultraviolet Nanowire Nanolasers," Huang, M. H. et al., *Science*, 292, No. 5523, pp. 1897-1899 (2001). A forest of vertically aligned single-walled carbon nanotubes behaving most similarly to a black body, absorbing light almost perfectly across a very wide spectral range (0.2-200 micrometers) is reported, for example, in "A Black Body Absorber From Vertically Aligned Single-Walled Carbon Nanotubes," Mizuno, K. et al., *Proceedings of the National Academy of Sciences of the United States of America (PNAS)*, 106 (15), pp. 6044-6047 (2009). A gecko's foot having nearly five hundred thousand keratinous hairs or seta, where each *setae* contains hundreds of projections terminating in 0.2-0.5 micrometer spatula-shaped structures is reported, for example, in "Adhesive Force of a Single Gecko Foot-Hair," Autumn, K. et al., *Nature*, 405, pp. 681-685 (2000), where the macroscopic orientation and preloading of the seta increased attachment force 600-fold above that of frictional measurements of the material. Aligned shaped abrasive grains in coated abrasive products are reported, for example, in U.S. Pat. No. 8,685,124 B2 (David et al.).

Methods of making aligned or oriented particle assemblies are also known in the art. For example, vertically aligned single-walled carbon nanotubes (forests) synthesized by water-assisted chemical vapor deposition (CVD) "SuperGrowth" on silicon substrates at 750° C. with ethylene as a carbon source and water as a catalyst enhancer and preserver are reported, for example, in "A Black Body Absorber From Vertically Aligned Single-Walled Carbon Nanotubes," Mizuno, K. et al., *Proceedings of the National Academy of Sciences of the United States of America (PNAS)*, 106 (15), pp. 6044-6047 (2009). Edge-oriented $MoS_2$ nanosheets synthesized by the evaporation of a single source precursor based on Mo(IV)-tetrakis(diethylaminodithiocarbomato) are reported, for example, in "Surface Modification Studies of Edge-Oriented Molybdenum Sulfide Nanosheets," Zhang, H. et al., *Langmuir*, 20, pp. 6914-6920 (2004). These methods, however, are restricted to thermally stable substrates due to the high temperature processing conditions involved (300° C. or higher), and involve the direct growth of the particles from gas or vapor sources.

Alternative methods may include the alignment of pre-formed particles, and may not require high temperatures (300° C. or higher) or involve direct growth of particles. For example, a method for applying particles to a backing having a make layer on one of the backing's opposed major surfaces, attaching the particle to the make layer by an electrostatic force is reported, for example, in U.S. Pat. No. 8,771,801 B2 (Moren et al.). Electrostatic flocking used to make vertically aligned, high-density arrays of carbon fibers (CFs) on a planar substrate is reported, for example, in "Elastomeric Thermal Interface Materials With High Through-Plane Thermal Conductivity From Carbon Fiber Fillers Vertically Aligned by Electrostatic Flocking," Uetani, K. et al., *Advanced Materials*, 26, pp. 5857-5862 (2014). The high voltage discharge during the electrostatic flocking process, however, is a common flocculent ignition hazard, and in general as particle size decreases, explosion severity tends to increase. Fiber flock ignition has been reported, in "Review of the Explosibility of Nontraditional Dusts," Worsfold, S. M. et al., *Industrial & Engineering Chemistry Research*, 51, pp. 7651-7655 (2012), as the cause of at least one explosion in flock manufacturing plants in recent years.

There is a desire for additional aligned or oriented particle assemblies and methods of making aligned or oriented particle assemblies, including aligned or oriented particle assemblies with added functionality beyond just the alignment or orientation of the particles.

SUMMARY

In one aspect, the present disclosure describes an article comprising a polymeric substrate having a first major surface comprising a plurality of two-dimensional particles (e.g., at least one of clay (including vermiculite) particles, glass particles, boron nitride particles, carbon particles, molybdenum disulfide particles, or bismuth oxychloride particles) attached thereto, the plurality of two-dimensional particles having a collective outer surface, and a layer comprising plasmonic material (e.g., at least one of gold, silver, copper, platinum, ruthenium, nickel, palladium, rhodium, iridium, chromium, aluminum, iron, tin, lead, zinc, a combination thereof (e.g., layers of, or co-deposited, platinum and ruthenium), or alloy thereof (e.g., Pt—Fe alloys)) on at least a portion of the collective outer surface, the plurality of particles each having an outer surface, wherein for at least 50 percent (in some embodiments, 55, 60, 65, 70, 75, 80, 85, 90, or even at least 95 percent) by number of the particles there is at least 20 (in some embodiments, at least 25, 30, 35, 40, 45, 50, 55, 60, 65, 70, 75, 80, 85, 90, or even at least 95) percent of the respective particle surface area consisting of points having tangential angles in a range from 5 to 175 (in some embodiments, at least one tangential angle in a range from 10 to 170, 15 to 165, 20 to 160, 25 to 155, 30 to 150, 35 to 145, 40 to 140, 45 to 135, 50 to 130, 55 to 125, 60 to 120, 65 to 115, 70 to 110, 75 to 105, 80 to 100, or even in a range from 85 to 95) degrees from the first major surface of the polymeric substrate. In some embodiments, the two-dimensional particles are dielectric particles. In some embodiments, a dielectric layer is disposed between the plurality of particles and plasmonic materials. The particles can be planar or non-planar.

In another aspect, the present disclosure describes an article comprising a polymeric substrate having a first major surface with a tie (i.e., promotes adhesion, but is not necessarily an adhesive) layer on the first major surface of the polymeric substrate and comprising a plurality of two-dimensional particles (e.g., at least one of clay (including vermiculite) particles, glass particles, boron nitride particles, carbon particles, molybdenum disulfide particles, or bismuth oxychloride particles) attached to the tie layer, having a collective outer surface, and a layer comprising plasmonic material (e.g., at least one of gold, silver, copper, platinum, ruthenium, nickel, palladium, rhodium, iridium, chromium, aluminum, iron, tin, lead, zinc, a combination thereof (e.g., layers of, or co-deposited, platinum and ruthenium), or alloy thereof (e.g., Pt—Fe alloys)) on at least a portion of the collective outer surface, the particles each having an outer surface, wherein for at least 50 percent (in some embodiments, 55, 60, 65, 70, 75, 80, 85, 90, or even at least 95 percent) by number of the particles there is at least 20 (in some embodiments, at least 25, 30, 35, 40, 45, 50, 55, 60, 65, 70, 75, 80, 85, 90, or even at least 95) percent of the respective particle surface area consisting of points having tangential angles in a range from 5 to 175 (in some embodiments, at least one tangential angle in a range from 10 to 170, 15 to 165, 20 to 160, 25 to 155, 30 to 150, 35 to 145, 40 to 140, 45 to 135, 50 to 130, 55 to 125, 60 to 120, 65 to 115, 70 to 110, 75 to 105, 80 to 100, or even in a range from 85 to 95) degrees from the first major surface of the polymeric substrate. In some embodiments, the two-dimensional particles are dielectric particles. In some embodiments, a dielectric layer is disposed between the plurality of particles and plasmonic materials. The particles can be planar or non-planar.

In another aspect, the present disclosure describes a method of orienting particles, the method comprising:

applying a plurality of particles (e.g., clay (including vermiculite) particles, glass particles, boron nitride particles, carbon particles, molybdenum disulfide particles, bismuth oxychloride particles, and combinations thereof) to a major surface of a polymeric substrate (e.g., heat shrinkable film, elastomeric film, elastomeric fibers, or heat shrinkable tubing) to provide a coating on the major surface of the polymeric substrate, the coating comprising the plurality of particles where the particles each independently have an acute angle from the major surface of the polymeric substrate;

dimensionally relaxing (e.g., via heating, via removing tension) the coated polymeric substrate, whereupon relaxing, at least 50 percent (in some embodiments, 55, 60, 65, 70, 75, 80, 85, 90, or even at least 95 percent) by number of the particles change the acute angle away from the first major surface of the polymeric substrate by at least greater than 5 (in some embodiments, at least greater than 10, 15, 20, 25, 30, 35, 40, 45, 50, 55, 60, 65, 70, 75, 80, or even at least greater than 85) degrees, the particles having a collective outer surface; and depositing a layer comprising plasmonic material (e.g., at least one of gold, silver, copper, platinum, ruthenium, nickel, palladium, rhodium, iridium, chromium, aluminum, iron, tin, lead, zinc, a combination thereof (e.g., layers of, or co-deposited, platinum and ruthenium), or alloy thereof (e.g., Pt—Fe alloys)) on at least a portion of the collective outer surface. In some embodiments, the method provides an article described herein. In some embodiments, the particles are one- or two-dimensional particles. In some embodiments, the particles are dielectric particles. In some embodiments, a dielectric layer is disposed between the plurality of particles and plasmonic materials. The particles can be planar or non-planar.

A method of curling particles, the method comprising:

applying a plurality of two-dimensional particles (e.g., at least one of clay (including vermiculite) particles, glass particles, boron nitride particles, carbon particles, molybdenum disulfide particles, or bismuth oxychloride particles) to a major surface of a polymeric substrate (e.g., heat shrinkable film, elastomeric film, elastomeric fibers, or heat shrinkable tubing) to provide a coating on the major surface of the polymeric substrate, the coating comprising the plurality of particles;

dimensionally relaxing (e.g., via heating, via removing tension) the coated polymeric substrate, the particles each having an outer surface, whereupon relaxing, for at least 50 percent (in some embodiments, 55, 60, 65, 70, 75, 80, 85, 90, or even at least 95 percent) by number of the particles there is at least 20 (in some embodiments, at least 25, 30, 35, 40, 45, 50, 55, 60, 65, 70, 75, 80, 85, 90, or even at least 95) percent of the respective particle surface area consisting of points having tangential angles change at least greater than 5 (in some embodiments, at least greater than 10, 15, 20, 25, 30, 35, 40, 45, 50, 55, 60, 65, 70, 75, 80, or even at least greater than 85) degrees from the major surface of the polymeric substrate, the particles having a collective outer surface; and depositing a layer comprising plasmonic material (e.g., at least one of gold, silver, copper, platinum, ruthenium, nickel, palladium, rhodium, iridium, chromium, aluminum, iron, tin, lead, zinc, a combination thereof (e.g., layers of, or co-deposited, platinum and ruthenium), or alloy thereof (e.g., Pt—Fe alloys)) on the at least a portion of the collective outer surface. In some embodiments, the two-dimensional particles are dielectric particles. In some embodiments, a dielectric layer is disposed between the plurality of particles and plasmonic materials. The particles can be planar or non-planar.

In this application:

"Aspect ratio" is the ratio of the longest dimension of a particle to the shortest dimension of the particle.

"Dielectric layer" refers to a layer comprising dielectric material (i.e., has a positive real permittivity at a given frequency of an applied field).

"Dielectric materials" refer to materials which exhibit positive real permittivity at a given frequency of an applied electric field.

"Plasmonic materials" refer to materials which exhibit negative real permittivity at a given frequency of an applied electric field. Plasmonic materials generally have charge carriers which can generate quantized, collective oscillations of electron density (i.e., plasmons) in a time varying electric field (e.g., electromagnetic radiation).

"Plasmons" refer collectively to (a discrete number) oscillations of the free electron density.

"Tangential angle" refers to the angle between the tangent plane at any given point on the outer surface of a particle and the major surface of the substrate to which the particle is attached, wherein the majority by volume of the particle itself is excluded within this angle.

Referring to FIG. 1C, particle 113B with plasmonic material 114B thereon is attached to first major surface 111 of dimensionally relaxed polymeric substrate 110. Tangent plane 117B is the plane tangent to point 116B on outer surface 115B of particle 113B. Tangential angle, $\alpha 1B$, at point 116B is the angle from tangent plane 117B to first major surface 111 of polymeric substrate 110 excluding the majority of particle 113B within the angle. Tangential angle, $\alpha 1B$, can be in a range from 5 degrees to 175 degrees from first major surface 111 of polymeric substrate 110. Basal plane 118B is the plane orthogonal to thickness and bisecting thickness of particle 113B. Acute angle, $\alpha 2B$, of particle 113B is the angle from the basal plane 118B to first major surface 111 of polymeric substrate 110.

Referring to FIG. 2C, particle $213B_2$ with plasmonic material $214B_2$ thereon is attached to first major surface 211 of polymeric substrate 210. Tangent plane $217B_2$ is the plane tangent to point $216B_2$ on surface $215B_2$ of particle $213B_2$. Tangential angle, $\alpha 2B_2$, at point $216B_2$ is the angle from tangent plane $217B_2$ to first major surface 211 of polymeric substrate 210 excluding the majority of particle $213B_2$ within the angle. Tangential angle, $\alpha 2B_2$, can be in a range from 5 degrees to 175 degrees from first major surface 211 of polymeric substrate 210.

Referring to FIG. 2D, particle $213B_1$ is attached to first major surface 211 of polymeric substrate 210. Tangent plane $217B_1$ is the plane tangent to point $216B_1$ on surface $215B_1$ of particle $213B_1$. Tangential angle, $\alpha 2B_1$, at point $216B_1$ is the angle from tangent plane $217B_1$ to first major surface 211 of polymeric substrate 210, and is an example of a tangent angle including a portion of a particle, but not a majority of the particle (i.e., excludes the majority of particle within the angle). Tangent plane $227B_3$ is the plane tangent to point $226B_3$ on surface $215B_1$ of particle $213B_1$. Tangential angle, $\alpha 2B_3$, at point $226B_3$ is the angle from tangent plane $227B_3$ to first major surface 211 of polymeric substrate 210 excluding the majority of particle $213B_1$ within the angle. Tangential angles, $\alpha 2B_1$ and $\alpha 2B_3$, can independently be in a range from 5 degrees to 175 degrees from first major surface 211 of polymeric substrate 210. Two thicknesses of particle $213B_1$ are shown as $230B_1$ and $231B_1$.

A "two-dimensional particle" refers to particles having a length, width, and thickness, wherein the width is not greater than the length, wherein the width is greater than the thickness, and wherein the length is at least two times the thickness. For particles having a variable thickness, the thickness of the particle is determined as the largest value of thickness. For a non-planar particle, the box length, box width, and box thickness of a particle, defined as the length, width, and thickness of the minimum (volume) bounding box of the particle is used to determine if a particle is "two-dimensional," wherein the box width is not greater than the box length, wherein the box width is greater than the box thickness, and wherein the box length is at least two times the box thickness. In some embodiments, the length is greater than the width. In some embodiments, the length is at least 2, 3, 4, 5 or even 10 times the width. In some embodiments, the width is at least 2, 3, 4, 5 or even 10 times the thickness. The length of a non-planar particle is taken as the box length of the non-planar particle. The actual thickness(es) of a particle is measured as between points across a thickness of the actual particle as shown, for example, in FIG. 2D, as thicknesses $230B_1$ and $231B_1$.

The "minimum (volume) bounding box" of a particle is a rectangular cuboid having the smallest volume that completely contains the particle, and can be calculated using the "HYBBRID" algorithm described in "Fast oriented bounding box optimization on the rotation group SO(3, R)", Chang, et al., *ACM Transactions on Graphics*, 30 (5), pp. 122 (2001), the disclosure of which is incorporated herein by reference. The "HYBBRID" (Hybrid Bounding Box Rotation Identification) algorithm approximates the minimal-volume bounding box of a set of points through a combination of two optimization components, namely the genetic algorithm and the Nelder-Mead algorithm. For example, referring to FIG. 3, cross-sectional view of (nonplanar) particle $213B_2$ in minimal (volume) bounding box 300.

"Acute angle" is the acute angle between the basal plane of a two-dimensional particle, or long axis of a one-dimensional particle, and the first major surface of the substrate. If the particle is non-planar, the surfaces of the minimum (volume) bounding box of the particle are used to determine the basal plane of the particle. The basal plane of a particle is the plane orthogonal to the direction of thickness and bisecting the thickness of the particle, for non-planar particles, the thickness of the minimum (volume) bounding box is used.

A "one-dimensional particle" refers to particles having a length, width, and thickness, wherein the length is at least two times the width, wherein the thickness is no greater than the width, and wherein the width is less than two times the thickness.

Generally, embodiments of methods described herein for aligning particles, particularly particles less than millimeters in scale, have relatively high throughput and lower processing temperatures than conventional methods. Generally, embodiments of methods described herein for aligning particles also offer more particle composition flexibility than conventional methods, including aligning combustible or explosive particles. Generally, embodiments of methods described herein for aligning particles also enable new constructions of aligned particles.

Although not wanting to be bound by theory, molecules adsorbed on plasmonic material tend to exhibit higher Raman scattering, higher fluorescence signals, and higher infrared absorption than would be expected from conventional measurements without the plasmonic material, allowing for greater sensitivity for detection of such molecules in the environment. Sharp surface features and areas of high curvature of plasmonic materials are known to strongly enhance local electromagnetic fields via localized surface plasmon resonances coupled with incident electromagnetic radiation. In some embodiments, vertically oriented, two dimensional dielectric materials provide high curvature edges upon which plasmonic materials may be coated, and therefore are believed to provide enhanced surface plasmon resonance effects when compared with plasmonic materials coated on lower curvature, flat surfaces.

Articles described herein are useful, for example, for identifying the presence of an analyte, and in some cases, determining the amount of analyte present in a matrix in contact with the plasmonic material of the article.

The present disclosure also provides a kit comprising:
an article described herein; and
instructions to use the article for spectroscopically (e.g., surface-enhanced Raman scattering, surface-enhanced fluorescence, or surface-enhanced infrared absorption) identifying the presence of an analyte.

The present disclosure also provides a method of spectroscopically identifying the presence of analyte comprising:
adsorbing analyte of interest to an article described herein;
irradiating the adsorbed analyte with electromagnetic radiation (e.g., via a laser);
obtaining at least one of an electromagnetic scattering spectrum, an electromagnetic reflection spectrum, an electromagnetic emission spectrum, or an electromagnetic absorption spectrum of the irradiated, adsorbed analyte; and
interpreting the spectrum to identify the respective electromagnetic scattering, electromagnetic reflection, electromagnetic emission, or electromagnetic absorption characteristics of the irradiated, adsorbed analyte. For example, the presence of a set of characteristic Raman scattering bands from an analyte can indicate the presence, or even the quantity, of the analyte in the sample volume.

DETAILED DESCRIPTION

Figure 1A:
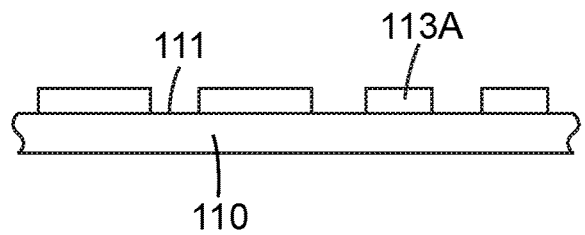
FIG. 1A is an exemplary cross-sectional schematic view of particles on an oriented substrate before dimensionally relaxing, where the cross-sectional plane is orthogonal to the width of the particles.
Figure 1B:
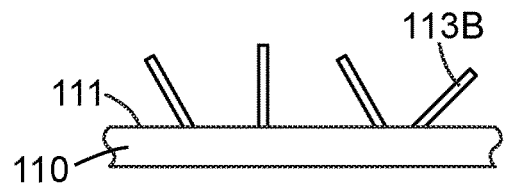
FIG. 1B is an exemplary cross-sectional schematic view of particles on a substrate after dimensionally relaxing, where the cross-sectional plane is orthogonal to the width of the particles.

Referring to FIG. 1A, particles, including particle 113A, are on first major surface 111 of polymeric substrate 110 before dimensionally relaxing. Referring to FIG. 1B, particles, including particle 113B, are on first major surface 111 of polymeric substrate 110 after dimensionally relaxing.

Figure 1C:
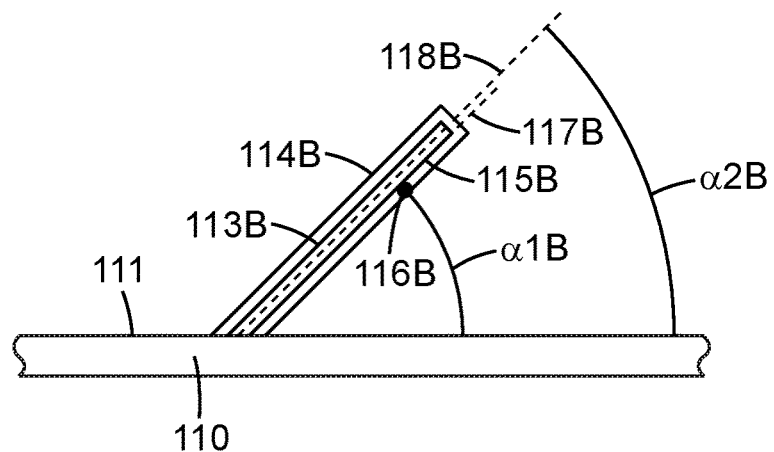
FIG. 1C is an exemplary cross-sectional schematic view of a particular particle attached to a major surface of a polymeric substrate shown in FIG. 1B, where the cross-sectional plane is orthogonal to the width of the particle.

Referring to FIG. 1C, particle 113B with plasmonic material 114B thereon is attached to first major surface 111 of dimensionally relaxed polymeric substrate 110. Tangent plane 117B is the plane tangent to point 116B on surface 115B of particle 113B. Tangential angle, α1B, at point 116B is the angle from tangent plane 117B to first major surface 111 of polymeric substrate 110 excluding the majority of particle 113B within the angle. Tangential angle, α1B, can be in a range from 5 degrees to 175 degrees from first major surface 111 of polymeric substrate 110. Basal plane 118B is the plane orthogonal to thickness and bisecting the thickness of particle 113B. Acute angle, α2B, of particle 113B is the angle from the basal plane 118B to first major surface 111 of polymeric substrate 110.

Figure 2A:
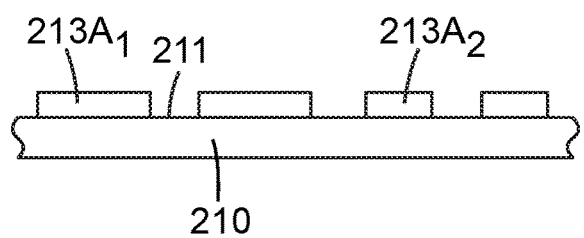
FIG. 2A is another exemplary cross-sectional schematic view of particles on an oriented substrate before dimensionally relaxing, where the cross-sectional plane is orthogonal to the width of the particles.
Figure 2B:
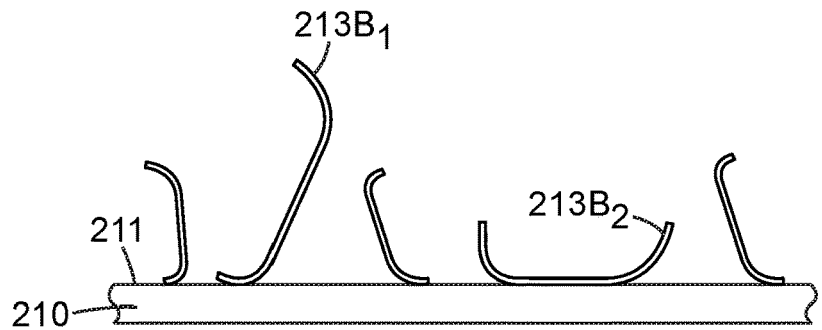
FIG. 2B is another exemplary cross-sectional schematic view of particles on a substrate after dimensionally relaxing, where the cross-sectional plane is orthogonal to the width of the particles.

Referring to FIG. 2A, particles, including particles $213A_1$ and $213A_2$, are on first major surface 211 of polymeric substrate 210 before dimensionally relaxing. Referring to FIG. 2B, particles, including particles $213B_1$ and $213B_2$, are on first major surface 211 of polymeric substrate 210 after dimensionally relaxing the substrate. It is also within the scope of the present disclosure for at least some of particles $213A_1$, $213A_2$, etc. to be curled (e.g., as shown for particle $213B_2$ in FIGS. 2B and 2C) before dimensionally relaxing, and then with dimensionally relaxing, orientate relative to the first major surface of substrate 210 (i.e., after relaxing be oriented, for example, like particle $213B_1$ in FIG. 2D). It is also within the scope of the present disclosure for at least some of particles $213A_1$, $213A_2$, etc., to be curled after dimensionally relaxing without orientating relative to first major surface 211 of substrate 210 (i.e., as shown, for example, for particle $213B_2$ in FIGS. 2B and 2C).

Figure 2C:
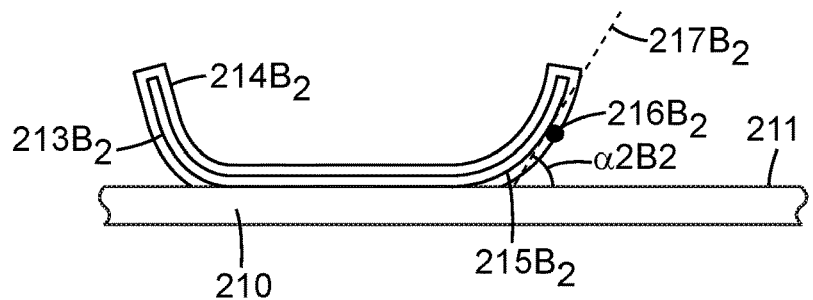
FIG. 2C is another exemplary cross-sectional schematic view of a particular non-planar particle attached to a major surface of a polymeric substrate shown in FIG. 2B, where the cross-sectional plane is orthogonal to the width of the particle.

Referring to FIG. 2C, particle $213B_2$ with plasmonic material $214B_2$ thereon is attached to first major surface 211 of polymeric substrate 210. Tangent plane $217B_2$ is the plane tangent to point $216B_2$ on surface $215B_2$ of particle $213B_2$. Tangential angle, $α2B_2$, at point $216B_2$ is the angle from tangent plane $217B_2$ to first major surface 211 of polymeric substrate 210 excluding the majority of particle $213B_2$ within the angle. Tangential angle, $α2B_2$, can be in a range from 5 degrees to 175 degrees from first major surface 211 of polymeric substrate 210.

Figure 2D:
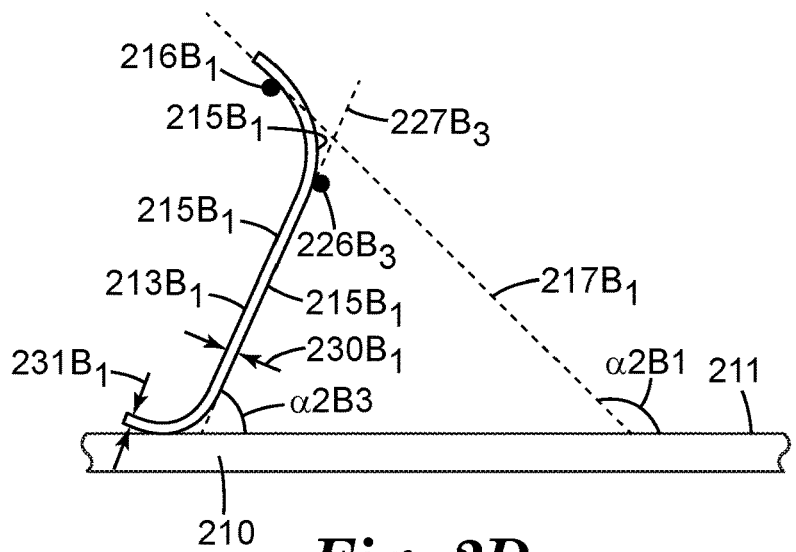
FIG. 2D is another exemplary cross-sectional schematic view of another particular non-planar particle attached to a major surface of a polymeric substrate shown in FIG. 2B, where the cross-sectional plane is orthogonal to the width of the particle.

Referring to FIG. 2D, particle $213B_1$ is attached to first major surface 211 of polymeric substrate 210. Tangent plane $217B_1$ is the plane tangent to point $216B_1$ on surface $215B_1$ of particle $213B_1$. Tangential angle, $α2B_1$, at point $216B_1$ is the angle from tangent plane $217B_1$ to first major surface 211 of polymeric substrate 210 excluding the majority of particle $213B_1$ within the angle. Tangent plane $227B_3$ is the plane tangent to point $226B_3$ on surface $215B_1$ of particle $213B_1$. Tangential angle, $α2B3$, at point $226B_3$ is the angle from tangent plane $227B_3$ to first major surface 211 of polymeric substrate 210 excluding the majority of particle $213B_1$ within the angle. Tangential angles, $α2B_1$ and $α2B3$, can independently be in a range from 5 degrees to 175 degrees from first major surface 211 of polymeric substrate 210. Two thicknesses of particle $213B_1$ are shown as $230B_1$ and $231B_1$.

Figure 3:
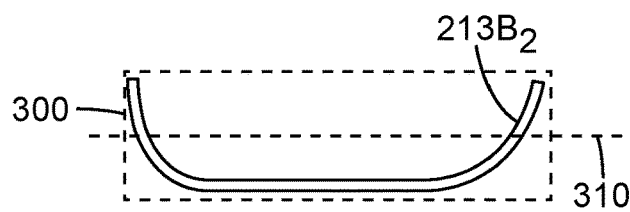
FIG. 3 is an exemplary cross-sectional schematic for discussion of (non-planar) particle $213B_2$ in minimal (volume) bounding box 300, where the cross-sectional plane is orthogonal to the width of the particle and bounding box.

Referring to FIG. 3, the cross section of the minimal (volume) bounding box 300 contains the cross-section of particle $213B_2$ (without plasmonic material thereon). Basal plane 310 is the plane orthogonal to box thickness and bisecting the box thickness of particle $213B_2$.

Exemplary polymeric substrates include heat shrinkable film, elastomeric film, elastomeric fibers, and heat shrinkable tubing. In general, the substrates possess the property of being dimensionally relaxable, where dimensionally relaxable refers to the property wherein at least one dimension of a material undergoes a reduction in strain during the relaxation process. For example, elastomeric materials in a stretched state are dimensionally relaxable, wherein the relaxation process is the release of stretch or strain in the elastic material. In the case of heat shrink materials, thermal energy is supplied to the material to allow release of the orientation-induced strain in the heat shrink material.

Examples of heat shrinkable materials include polyolefins, polyurethanes, polystyrenes, polyvinylchloride, poly(ethylene-vinyl acetate), fluoropolymers (e.g., polytetrafluoroethylene (PTFE), synthetic fluoroelastomer (available, for example, under the trade designation "VITON" from Dupont, Wilmington, Del.), polyvinylidenefluoride (PVDF), fluorinated ethylene propylene (FEP)), silicone rubbers, and polyacrylates. Examples of other useful polymeric substrate materials are shape memory polymers such as polyethylene terephthalate (PET), polyethyleneoxide (PEO), poly(1,4-butadien), polytetrahydrofuran, poly(2-methyl-2-oxazoline), polynorbornene, and block-co-polymers of combinations thereof. Examples of elastomeric materials include natural and synthetic rubbers, fluoroelastomers, silicone elastomers, polyurethanes, and polyacrylates.

In some embodiments of articles described herein, a tie layer is disposed between the first major surface of the polymeric substrate and the plurality of particles. In some embodiments, the tie layer is a continuous layer (i.e., the layer does not contain any openings extending from one major surface to another major surface of the layer). In some embodiments, the tie layer is a discontinuous layer (i.e., the layer contains at least one opening extending from one major surface to another major surface of the layer). For example, some discontinuous layers have a continuous matrix with openings throughout the layer. Some discontinuous layers comprise a number of discontinuous portions making up the layer (e.g., islands of the tie material).

The tie layer encompasses any number of layers that promote adhesion between the particle layer and the dimensionally changing polymeric substrate. In some embodiments, the layer may be an adhesive such as a curable acrylate, epoxy, or urethane resin. Other examples of tie layers include pressure sensitive adhesive that may further be comprised of materials such as polyacrylates, natural and synthetic rubbers, polyurethanes, latex, and resin modified silicones; meltable film (e.g., a crystalline polyolefin and polyacrylate); and soft materials (e.g., hydrogels of polyacrylates and polyacrylamides). The tie layer may be, for example, a film material with incorporated functional groups to promote adhesion to the polymeric substrate, the particles, or both. Examples of functionalized films include maleated polyethylene such as those available under the trade designation "AC RESINS" from Honeywell, Morrisville, N.J.

The tie layer may be provided by techniques known in the art, including lamination or deposition methods such as solvent coating, hot-melt coating, transfer lamination, curtain coating, gravure coating, stencil printing, vapor deposition, and aerosol spraying.

In some embodiments, the particles are dielectric materials. Exemplary dielectric particles include clay (including vermiculite) particles, glass particles, boron nitride particles, carbon particles, molybdenum disulfide particles, bismuth oxychloride particles, and combinations thereof. Suitable clay particles (vermiculite) are available, for example, under trade designation "MICROLITE POWDER VERMICULITE DISPERSION" from Specialty Vermiculite Corp., Enoree, S.C. Suitable glass flakes are available, for example, under trade designation "ECR GLASSFLAKE GF001" from Glass Flake Ltd., Leeds, West Yorkshire, UK. Suitable boron nitride particles are available, for example, from Aldrich Chemical Co., Inc., Milwaukee, Wis. Suitable carbon particles are available, for example, under the trade designation "XGNP-M-5" from XG Sciences, Lansing, Mich. Suitable molybdenum disulfide particles are available, for example, under the trade designation "MOLYKOTE Z" from Dow Corning Corp., Midland, Mich. Suitable bismuth oxychloride particles are available, for example, from Alfa Inorganics, Beverly, Mass.

In some embodiments, the particles each have lengths greater than 1 micrometer. In some embodiments, the particles have a largest dimension in a range from 1 micrometer to 50 micrometers (in some embodiments, in a range from 1 micrometer to 25 micrometers, or even 2 micrometers to 15 micrometers).

In some embodiments, the particles have thickness no greater than 300 nm (in some embodiments, no greater than 250 nm, 200 nm, or even no greater than 150 nm; in some embodiments, in a range from 100 nm to 200 nm).

In some embodiments, the particles have an aspect ratio of at least greater than 2:1 (in some embodiments, at least greater than 3:1, 4:1, 5:1, 10:1, 15:1, 20:1, 25:1, 50:1, 75:1, 100:1, 250:1, 500:1, 750:1, or even at least greater than 1000:1). In some embodiments, for at least 50 percent (in some embodiments, 55, 60, 65, 70, 75, 80, 85, 90, or even at least 95 percent) by number of the particles there is at least 20 (in some embodiments, at least 25, 30, 35, 40, 45, 50, 55, 60, 65, 70, 75, 80, 85, 90, or even at least 95) percent of the respective particle surface area consisting of points having tangential angles in a range from 5 to 175 (in some embodiments, at least one angle in a range 10 to 170, 15 to 165, 20 to 160, 25 to 155, 30 to 150, 35 to 145, 40 to 140, 45 to 135, 50 to 130, 55 to 125, 60 to 120, 65 to 115, 70 to 110, 75 to 105, 80 to 100, or even in a range from 85 to 95) degrees from the first major surface of the polymeric substrate.

Plasmonic materials generally have charge carriers which can generate plasmons. Surface plasmons exist at the interface between plasmonic and dielectric materials, and can be excited, for example, by incident electromagnetic radiation. Surface plasmon resonance occurs when the natural frequency of the surface plasmons match the incident electromagnetic radiation frequency, leading to enhanced local electric fields which in turn allow for detection of molecules adsorbed on the plasmonic material surface.

In some embodiments, the plasmonic material is a plasmonic material in at least one wavelength in the ultraviolet wavelength range (i.e., at least one wavelength in a range from 10 nm to 400 nm). Examples of such plasmonic materials include at least one of palladium, nickel, rhodium, chromium, aluminum, zinc, a combination thereof, or an alloy thereof. In some embodiments, the plasmonic material is a plasmonic material in at least one wavelength in the visible wavelength range (i.e., at least one wavelength in a range from 400 nm to 700 nm). Examples of such plasmonic materials include at least one of gold, silver, copper, chromium, aluminum, palladium, rhodium, nickel, zinc, iron, a combination thereof, or an alloy thereof. In some embodiments, the plasmonic material is a plasmonic material in at least one wavelength in the infrared wavelength range (i.e., at least one wavelength in a range from 700 nm to 1 mm). Examples of such plasmonic materials include at least one of silver, copper, gold, tin, lead, iron, platinum, ruthenium, nickel, palladium, rhodium, iridium, a combination thereof, or an alloy thereof.

In some embodiments, the layer comprising plasmonic material has a planar equivalent thickness (i.e., the thickness on a substantially flat, planar substrate) of at least 10 nm (in some embodiments, at least 15 nm, 20 nm, 25 nm, 30 nm, 40 nm, 50 nm, 100 nm, 200 nm, 250 nm, or even at least 300 nm or more; in some embodiments, in a range from 25 nm to 300 nm, 25 nm to 250 nm, 30 nm to 200 nm, 30 nm to 150 nm, 40 nm to 200 nm, or even 40 nm to 150 nm).

In some embodiments, the layer comprising plasmonic material is continuous (i.e., the layer does not contain any openings extending from one major surface to another major surface of the layer). In some embodiments, the layer comprising plasmonic material is discontinuous (i.e., the layer contains at least one opening extending from one major surface to another major surface of the layer).

In some embodiments, a dielectric layer is disposed between the plasmonic material and the plurality of particles. A dielectric layer is a layer comprising dielectric material (i.e., has a positive real permittivity at a given frequency of an applied field). Exemplary dielectric layers include at least one of an oxide, a carbide, a nitride, a chalcogenide, or a polymer. Exemplary oxides include at least one of silica, alumina, zirconia, or titania. Exemplary carbides at least one of silicon carbide, boron carbide, or transition metal carbide (e.g., at least one of iron carbide, tungsten carbide, titanium carbide, or zirconium carbide). Exemplary nitrides include at least one of boron nitride, silicon nitride, aluminum nitride, gallium nitride, indium nitride, or transition metal nitrides (e.g., at least one of titanium nitride, iron nitride, copper nitride, zirconium nitride, or tungsten nitride). Exemplary chalcogenides include at least one of a monochalcogenide (e.g., at least one of zinc sulfide, zinc selenide, cadmium sulfide, cadmium selenide, or cadmium telluride) or a dichalcogenide (e.g., at least one of titanium disulfide, titanium diselenide, titanium ditelluride, molybdenum disulfide, molybdenum diselenide, tungsten disulfide, or tungsten diselenide). The deposition of the oxide, carbide, nitride, or chalcogenide layers may be applied by, for example, using techniques in the art, including physical vapor deposition, chemical vapor deposition, molten salt synthesis, or sol-gel synthesis. Dielectric polymer layers include, for example, polytetrafluoroethylene (PTFE), polyvinylidene fluoride (PVDF), fluorinated ethylene-propylene (FEP), perfluoroalkoxy polymer (PFA), perfluoroelastomers, polyolefins, polyurethanes, polystyrenes, polyvinylchloride, poly(ethylene-vinyl acetate), polyacrylate, polyacrylamide, polyethylene terephthalate (PET), polyethyleneoxide (PEO), poly(1,4-butadien), polytetrahydrofuran, poly(2-methyl-2-oxazoline), polynorbornene, and block-co-polymers of combinations thereof. The deposition of dielectric polymer layers may be applied, for example, by spraying a fluoropolymer latex solution onto the particles and allowing the solvent to dry, leaving behind a fluoropolymer coating on the surface of the particles. An example of a fluoropolymer spray that can provide a fluoropolymer deposition is available, for example, from DuPont under the trade designation "TEFLON NON-STICK DRY FILM LUBRICANT AEROSOL SPRAY." Other dielectric polymer materials that may be used to impart low energy surfaces include silicones (e.g., silicone oils, silicone greases, silicone elastomers, silicone resins, and silicone caulks). Polymer layer deposition may be applied through a number of coating, lamination, or deposition methods, including solvent coating, hot-melt coating, transfer lamination, curtain coating, gravure coating, stencil printing, vapor deposition, and aerosol spraying.

In some embodiments, the dielectric layer is continuous layer (i.e., the layer does not contain any openings extending from one major surface to another major surface of the layer). In some embodiments, the dielectric layer is discontinuous layer (i.e., the layer contains at least one opening extending from one major surface to another major surface of the layer). For example, some discontinuous layers have a continuous matrix with openings throughout the layer. Some discontinuous layers comprise a number of discontinuous portions making up the layer (e.g., islands of the tie material). The polymeric substrate having the plurality of particles thereon can be dimensionally relaxed, for example, via heating and/or removing tension where at least 50 percent (in some embodiments, 55, 60, 65, 70, 75, 80, 85, 90, or even at least 95 percent) by number of the particles change the acute angle away from the first major surface by at least greater than 5 (in some embodiments, at least greater than 10, 15, 20, 25, 30, 35, 40, 45, 50, 55, 60, 65, 70, 75, 80, or even at least greater than 85). For example, pre-stretched elastomeric substrates can be relaxed by releasing the tension holding the substrate in the stretched state. In the case of heat shrinkable substrates, the substrates may be placed, for example, in a heated oven or heated fluid until the desired reduction in dimension is achieved.

In some embodiments, the coated substrate has an original length and is dimensionally relaxed in at least one dimension by at least 20 (in some embodiments, at least 25, 30, 40, 50, 60, 70, or even at least 80) percent of the original length. Higher percent changes of original length upon dimensional relaxation typically produce greater changes in orientation angle of the particles with the substrate after relaxation.

Articles described herein are useful, for example, for identifying the presence of an analyte, and in some cases determining the amount of analyte present in a matrix in contact with the plasmonic material of the article.

The present disclosure also provides a kit comprising:
an article described herein; and
instructions to use the article for spectroscopically (e.g., surface-enhanced Raman scattering, surface-enhanced fluorescence, or surface-enhanced infrared absorption) identifying the presence of an analyte.

The present disclosure also provides a method of spectroscopically identifying the presence of analyte comprising:
adsorbing analyte of interest to an article described herein;
irradiating the adsorbed analyte with electromagnetic radiation (e.g., via a laser);
obtaining at least one of an electromagnetic scattering spectrum, an electromagnetic reflection spectrum, an electromagnetic emission spectrum, or an electromagnetic absorption spectrum of the irradiated, adsorbed analyte; and
interpreting the spectrum to identify the respective electromagnetic scattering, electromagnetic reflection, electromagnetic emission, or electromagnetic absorption characteristics of the irradiated, adsorbed analyte. For example, the presence of a set of characteristic Raman scattering bands from an analyte can indicate the presence, or even the quantity, of the analyte in the sample volume.

Exemplary Embodiments

1A. An article comprising a polymeric substrate having a first major surface comprising a plurality of two-dimensional particles (e.g., at least one of clay (including vermiculite) particles, glass particles, boron nitride particles, carbon particles, molybdenum disulfide particles, or bismuth oxychloride particles) attached thereto, the plurality of two-dimensional particles having a collective outer surface, and a layer comprising plasmonic material (e.g., at least one of gold, silver, copper, platinum, ruthenium, nickel, palladium, rhodium, iridium, chromium, aluminum, iron, tin, lead, zinc, a combination thereof (e.g., layers of, or co-deposited, platinum and ruthenium), or alloy thereof (e.g., Pt—Fe alloys)) on at least a portion of the collective outer surface, wherein for at least 50 percent (in some embodiments, 55, 60, 65, 70, 75, 80, 85, 90, or even at least 95 percent) by number of the particles there is at least 20 (in some embodiments, at least 25, 30, 35, 40, 45, 50, 55, 60, 65, 70, 75, 80, 85, 90, or even at least 95) percent of the respective particle surface area consisting of points having tangential angles in a range from 5 to 175 (in some embodiments, at least one tangential angle in a range from 10 to 170, 15 to 165, 20 to 160, 25 to 155, 30 to 150, 35 to 145, 40 to 140, 45 to 135, 50 to 130, 55 to 125, 60 to 120, 65 to 115, 70 to 110, 75 to 105, 80 to 100, or even in a range from 85 to 95) degrees from the first major surface of the polymeric substrate. The particles can be planar or non-planar.

2A. The article of Exemplary Embodiment 1A, wherein the particles each have lengths greater than 1 micrometer.

3A. The article of any preceding A Exemplary Embodiment, wherein the plasmonic material is a plasmonic material in at least one wavelength in the ultraviolet wavelength range.

4A. The article of Exemplary Embodiment 3A, wherein the plasmonic material is at least one of palladium, nickel, rhodium, chromium, aluminum, zinc, a combination thereof, or an alloy thereof.

5A. The article of any preceding A Exemplary Embodiment, wherein the plasmonic material is a plasmonic material in at least one wavelength in the visible wavelength range.

6A. The article of Exemplary Embodiment 5A, wherein the plasmonic material is at least one of gold, silver, copper, chromium, aluminum, palladium, rhodium, nickel, zinc, iron, a combination thereof, or an alloy thereof.

7A. The article of any preceding A Exemplary Embodiment, wherein the plasmonic material is a plasmonic material in at least one wavelength in the infrared wavelength.

8A. The article of Exemplary Embodiment 7A, wherein the plasmonic material is at least one of silver, copper, gold, tin, lead, iron, platinum, ruthenium, nickel, palladium, rhodium, iridium, a combination thereof, or an alloy thereof.

9A. The article of any preceding A Exemplary Embodiment, wherein the layer comprising plasmonic material has a planar equivalent of at least 10 nm (in some embodiments, at least 15 nm, 20 nm, 25 nm, 30 nm, 40 nm, 50 nm, 100 nm, 200 nm, 250 nm, or even at least 300 nm or more; in some embodiments, in a range from 25 nm to 300 nm, 25 nm to 250 nm, 30 nm to 200 nm, 30 nm to 150 nm, 40 nm to 200 nm, or even 40 nm to 150 nm).

10A. The article of any of Exemplary Embodiments 1A to 8A, wherein the layer comprising plasmonic material comprises gold having a planar equivalent thickness of at least 10 nm (in some embodiments, at least 15 nm, 20 nm, 25 nm, 30 nm, 40 nm, or even at least 50 nm; in some embodiments, in a range from 25 nm to 250 nm, 30 nm to 200 nm, 30 nm to 150 nm, 40 nm to 200 nm, or even 40 nm to 150 nm).

11A. The article of any of Exemplary Embodiments 1A to 8A, wherein the layer comprising plasmonic material comprises silver having a planar equivalent thickness of at least at least 10 nm (in some embodiments, at least 15 nm, 20 nm, 25 nm, 30 nm, 40 nm, 50 nm, 100 nm, 200 nm, 250 nm, or even at least 300 nm or more).

12A. The article of any of Exemplary Embodiments 1A to 8A, wherein the layer comprising plasmonic material other than gold having a planar equivalent thickness of at least 10 nm (in some embodiments, at least 15 nm, 20 nm, 25 nm, 30 nm, 40 nm, 50 nm, 75 nm, 100 nm, 150 nm, 200 nm, 250 nm, or even at least 300 nm or more; in some embodiments, in a range from 25 nm to 300 nm, 25 nm to 250 nm, 30 nm to 200 nm, 30 nm to 150 nm, 40 nm to 200 nm, or even 40 nm to 150 nm).

13A. The article of any preceding A Exemplary Embodiment, wherein the layer comprising plasmonic material is continuous.

14A. The article of any of Exemplary Embodiments 1A to 12A, wherein the layer comprising plasmonic material is discontinuous.

15A. The article of any preceding A Exemplary Embodiment, wherein the particles have thickness no greater than 300 nm (in some embodiments, no greater than 250 nm, 200 nm, or even no greater than 150 nm; in some embodiments, in a range from 100 nm to 200 nm).

16A. The article of any preceding A Exemplary Embodiment, wherein the particles have a largest dimension in a range from 1 micrometer to 50 micrometers (in some embodiments, in a range from 1 micrometer to 25 micrometers, or even 2 micrometers to 15 micrometers).

17A. The article of any preceding A Exemplary Embodiment, wherein the particles comprise a dielectric material.

18A. The article of any preceding A Exemplary Embodiment further comprising a tie layer disposed between the first major surface of the polymeric substrate and the plurality of particles.

19A. The article of Exemplary Embodiment 18A, wherein the tie layer is a continuous layer.

20A. The article of Exemplary Embodiment 18A, wherein the tie layer is a discontinuous layer.

21A. The article of any preceding A Exemplary Embodiment, wherein the ratio of the particle width to the particle thickness is at least greater than 2:1 (in some embodiments, at least greater than 3:1, 4:1, 5:1, 10:1, 15:1, 20:1, 25:1, 50:1, 75:1, or even at least greater than 100:1).

22A. The article of any preceding A Exemplary Embodiment, wherein the particles have an aspect ratio of at least greater than 3:1 (in some embodiments, at least greater than 4:1, 5:1, 10:1, 15:1, 20:1, 25:1, 50:1, 75:1, 100:1, 250:1, 500:1, 750:1, or even at least greater than 1000:1).

23A. The article of any preceding A Exemplary Embodiment further comprising a dielectric layer disposed between the plurality of particles and plasmonic material.

24A. The article of Exemplary Embodiment 23A, wherein the dielectric layer comprises at least one of an oxide, a carbide, a nitride, a chalcogenide, or a polymer.

25A. The article of either Exemplary Embodiment 23A or 24A, wherein the dielectric layer is a continuous layer.

26A. The article of either Exemplary Embodiment 23A or 24A, wherein the dielectric layer is a discontinuous layer.

1B. An article comprising a polymeric substrate having a first major surface with a tie layer on the first major surface of the polymeric substrate and a plurality two-dimensional particles (e.g., at least one of clay (including vermiculite) particles, glass particles, boron nitride particles, carbon particles, molybdenum disulfide particles, or bismuth oxychloride particles) attached to the tie layer, having a collective outer surface, and a layer comprising plasmonic material (e.g., at least one of gold, silver, copper, platinum, ruthenium, nickel, palladium, rhodium, iridium, chromium, aluminum, iron, tin, lead, zinc, a combination thereof (e.g., layers of, or co-deposited, platinum and ruthenium), or alloy thereof (e.g., Pt—Fe alloys)) on at least a portion of the collective outer surface, the particles each having an outer surface, wherein for at least 50 percent (in some embodiments, 55, 60, 65, 70, 75, 80, 85, 90, or even at least 95 percent) by number of the particles there is at least 20 (in some embodiments, at least 25, 30, 35, 40, 45, 50, 55, 60, 65, 70, 75, 80, 85, 90, or even at least 95) percent of the respective particle surface area consisting of points having tangential angles in a range from 5 to 175 (in some embodiments, at least one tangential angle in a range from 10 to 170, 15 to 165, 20 to 160, 25 to 155, 30 to 150, 35 to 145, 40 to 140, 45 to 135, 50 to 130, 55 to 125, 60 to 120, 65 to 115, 70 to 110, 75 to 105, 80 to 100, or even in a range from 85 to 95) degrees from the first major surface of the polymeric substrate. The particles can be planar or non-planar.

2B. The article of Exemplary Embodiment 1B, wherein the two-dimensional particles comprise a dielectric material.

3B. The article of any preceding B Exemplary Embodiment, wherein the plasmonic material is a plasmonic material in at least one wavelength in the ultraviolet wavelength range.

4B. The article of Exemplary Embodiment 3B, wherein the plasmonic material is at least one of palladium, nickel, rhodium, chromium, aluminum, zinc, a combination thereof, or an alloy thereof.

5B. The article of any preceding B Exemplary Embodiment, wherein the plasmonic material is a plasmonic material in at least one wavelength in the visible wavelength.

6B. The article of Exemplary Embodiment 5B, wherein the plasmonic material is at least one of gold, silver, copper, chromium, aluminum, palladium, rhodium, nickel, zinc, iron, a combination thereof, or an alloy thereof.

7B. The article of any preceding B Exemplary Embodiment, wherein the plasmonic material is a plasmonic material in at least one wavelength in the infrared wavelength range.

8B. The article of Exemplary Embodiment 7B, wherein the plasmonic material is at least one of silver, copper, gold, tin, lead, iron, platinum, ruthenium, nickel, palladium, rhodium, iridium, a combination thereof, or an alloy thereof.

9B. The article of any preceding B Exemplary Embodiment, wherein the layer comprising plasmonic material has a planar equivalent thickness of at least 10 nm (in some embodiments, at least 15 nm, 20 nm, 25 nm, 30 nm, 40 nm, 50 nm, 100 nm, 200 nm, 250 nm, or even at least 300 nm or more; in some embodiments, in a range from 25 nm to 300 nm, 25 nm to 250 nm, 30 nm to 200 nm, 30 nm to 150 nm, 40 nm to 200 nm, or even 40 nm to 150 nm).

10B. The article of any of Exemplary Embodiments 1B to 8B, wherein the layer comprising plasmonic material comprises gold having a planar equivalent thickness of at least 10 nm (in some embodiments, at least 15 nm, 20 nm, 25 nm, 30 nm, 40 nm, or even at least 50 nm; in some embodiments, in a range from 25 nm to 250 nm, 30 nm to 200 nm, 30 nm to 150 nm, 40 nm to 200 nm, or even 40 nm to 150 nm).

11B. The article of any of Exemplary Embodiments 1B to 8B, wherein the layer comprising plasmonic material comprises silver having a planar equivalent thickness of at least at least 10 nm (in some embodiments, at least 15 nm, 20 nm, 25 nm, 30 nm, 40 nm, 50 nm, 100 nm, 200 nm, 250 nm, or even at least 300 nm or more).

12B. The article of any of Exemplary Embodiments 1B to 8B, wherein the layer comprising plasmonic material comprises other than gold having a planar equivalent thickness of at least 10 nm (in some embodiments, at least 15 nm, 20 nm, 25 nm, 30 nm, 40 nm, 50 nm, 75 nm, 100 nm, 150 nm, 200 nm, 250 nm, or even at least 300 nm or more; in some embodiments, in a range from 25 nm to 300 nm, 25 nm to 250 nm, 30 nm to 200 nm, 30 nm to 150 nm, 40 nm to 200 nm, or even 40 nm to 150 nm).

13B. The article of any preceding B Exemplary Embodiment, wherein the layer comprising plasmonic material is continuous.

14B. The article of any of Exemplary Embodiments 1B to 12B, wherein the layer comprising plasmonic material is discontinuous.

15B. The article of any preceding B Exemplary Embodiment, wherein the particles have thickness no greater than 300 nm (in some embodiments, no greater than 250 nm, 200 nm, or even no greater than 150 nm; in some embodiments, in a range from 100 nm to 200 nm).

16B. The article of any preceding B Exemplary Embodiment, wherein the tie layer is a continuous layer.

17B. The article of any of Exemplary Embodiments 1B to 15B, wherein the tie layer is a discontinuous layer.

18B. The article of any preceding B Exemplary Embodiment, wherein the tie layer comprises adhesive.

19B. The article of any preceding B Exemplary Embodiment, wherein the particles have a largest dimension in a range from 1 micrometer to 50 micrometers (in some embodiments, in a range from 1 micrometer to 25 micrometers, or even 2 micrometers to 15 micrometers).

20B. The article of any preceding B Exemplary Embodiment, wherein the particles have thickness no greater than 300 nm (in some embodiments, no greater than 250 nm, 200 nm, or even no greater than 150 nm; in some embodiments, in a range from 100 nm to 200 nm).

21B. The article of any preceding B Exemplary Embodiment, wherein the ratio of the particle width to the particle thickness is at least greater than 2:1 (in some embodiments, at least greater than 3:1, 4:1, 5:1, 10:1, 15:1, 20:1, 25:1, 50:1, 75:1, or even at least greater than 100:1).

22B. The article of any preceding B Exemplary Embodiment, wherein the particles have an aspect ratio of at least greater than 3:1 (in some embodiments, at least greater than 4:1, 5:1, 10:1, 15:1, 20:1, 25:1, 50:1, 75:1, 100:1, 250:1, 500:1, 750:1, or even at least greater than 1000:1).

23B. The article of any preceding B Exemplary Embodiment further comprising a dielectric layer disposed between the plurality of particles and plasmonic material.

24B. The article of Exemplary Embodiment 23B, wherein the dielectric layer comprises at least one of an oxide, a carbide, a nitride, a chalcogenide, or a polymer.

25B. The article of either Exemplary Embodiment 23B or 24B, wherein the dielectric layer is a continuous layer.

26B. The article of either Exemplary Embodiment 23B or 24B, wherein the dielectric layer is a discontinuous layer.

1C. A method of orienting particles, the method comprising:

applying a plurality of particles (e.g., at least one of clay (including vermiculite) particles, glass particles, boron nitride particles, carbon particles, molybdenum disulfide particles, or bismuth oxychloride particles) to a major surface of a polymeric substrate (e.g., heat shrinkable film, elastomeric film, elastomeric fibers, or heat shrinkable tubing) to provide a coating on the major surface of the polymeric substrate, the coating comprising the plurality of particles where the particles each independently have an acute angle from the major surface of the polymeric substrate;

dimensionally relaxing (e.g., via heating, via removing tension) the coated polymeric substrate, whereupon relaxing, at least 50 percent (in some embodiments, 55, 60, 65, 70, 75, 80, 85, 90, or even at least 95 percent) by number of the particles change the acute angle away from the first major surface of the polymeric substrate by at least greater than 5 (in some embodiments, at least greater than 10, 15, 20, 25, 30, 35, 40, 45, 50, 55, 60, 65, 70, 75, 80, or even at least greater than 85) degrees, the particles having a collective outer surface; and depositing a layer comprising plasmonic material (e.g., at least one of gold, silver, copper, platinum, ruthenium, nickel, palladium, rhodium, iridium, chromium, aluminum, iron, lead, tin, zinc, a combination thereof (e.g., layers of, or co-deposited, platinum and ruthenium), or alloy thereof (e.g., Pt—Fe alloys)) on at least a portion of the collective outer surface. The particles can be one- or two-dimensional particles. The particles can be planar or non-planar.

2C. The method of Exemplary Embodiment 1C, the particles have an aspect ratio of at least greater than 2:1 (in some embodiments, at least greater than 3;1, 4;1, 5:1, 10:1, 15:1, 20:1, 25:1, 50:1, 75:1, 100:1, 250:1, 500:1, 750:1 or even at least greater than 1000:1).

3C. The method of any preceding C Exemplary Embodiment, wherein the particles comprise a dielectric material.

4C. The method of any preceding C Exemplary Embodiment, wherein the plasmonic material is a plasmonic material in at least one wavelength in the ultraviolet wavelength range.

5C. The method of Exemplary Embodiment 4C, wherein the plasmonic material is at least one of palladium, nickel, rhodium, chromium, aluminum, zinc, a combination thereof, or an alloy thereof.

6C. The method of any preceding C Exemplary Embodiment, wherein the plasmonic material is a plasmonic material in at least one wavelength in the visible wavelength range.

7C. The method of Exemplary Embodiment 6C, wherein the plasmonic material is at least one of gold, silver, copper, chromium, aluminum, palladium, rhodium, nickel, zinc, iron, a combination thereof, or an alloy thereof.

8C. The method of any preceding C Exemplary Embodiment, wherein the plasmonic material is a plasmonic material in at least one wavelength in the infrared wavelength range.

9C. The method of Exemplary Embodiment 8C, wherein the plasmonic material is at least one of silver, copper, gold, tin, lead, iron, platinum, ruthenium, nickel, palladium, rhodium, iridium, a combination thereof, or an alloy thereof.

10C. The method of any preceding C Exemplary Embodiment, wherein the layer comprising plasmonic material has a planar equivalent thickness of at least 10 nm (in some embodiments, at least 15 nm, 20 nm, 25 nm, 30 nm, 40 nm, 50 nm, 100 nm, 200 nm, 250 nm, or even at least 300 nm or more; in some embodiments, in a range from 25 nm to 300 nm, 25 nm to 250 nm, 30 nm to 200 nm, 30 nm to 150 nm, 40 nm to 200 nm, or even 40 nm to 150 nm).

11C. The method of any of Exemplary Embodiments 1C to 9C, wherein the layer comprising plasmonic material comprises gold having a planar equivalent thickness of at least 10 nm (in some embodiments, at least 15 nm, 20 nm, 25 nm, 30 nm, 40 nm, or even at least 50 nm; in some embodiments, in a range from 25 nm to 250 nm, 30 nm to 200 nm, 30 nm to 150 nm, 40 nm to 200 nm, or even 40 nm to 150 nm).

12C. The method of any of Exemplary Embodiments 1C to 9C, wherein the layer comprising plasmonic material comprises silver having a planar equivalent thickness of at least at least 10 nm (in some embodiments, at least 15 nm, 20 nm, 25 nm, 30 nm, 40 nm, 50 nm, 100 nm, 200 nm, 250 nm, or even at least 300 nm or more).

13C. The method of any of Exemplary Embodiments 1C to 9C, wherein the layer comprising plasmonic material other than gold having a planar equivalent thickness of at least 10 nm (in some embodiments, at least 15 nm, 20 nm, 25 nm, 30 nm, 40 nm, 50 nm, 75 nm, 100 nm, 150 nm, 200 nm, 250 nm, or even at least 300 nm or more; in some embodiments, in a range from 25 nm to 300 nm, 25 nm to 250 nm, 30 nm to 200 nm, 30 nm to 150 nm, 40 nm to 200 nm, or even 40 nm to 150 nm).

14C. The method of any preceding C Exemplary Embodiment, wherein the layer comprising plasmonic material is continuous.

15C. The method of any of Exemplary Embodiments 1C to 13C, wherein the layer comprising plasmonic material is discontinuous.

16C. The method of any preceding C Exemplary Embodiment, wherein the particles have thickness no greater than 300 nm (in some embodiments, no greater than 250 nm, 200 nm, or even no greater than 150 nm; in some embodiments, in a range from 100 nm to 200 nm).

17C. The method of any preceding C Exemplary Embodiment, wherein the coated polymeric substrate has an original length and is dimensionally relaxed in at least one dimension by at least 20 (in some embodiments, at least 25, 30, 40, 50, 60, 70, or even at least 80) percent of the original length.

18C. The method of any preceding C Exemplary Embodiment, wherein the particles have a largest dimension in a range from 1 micrometer to 50 micrometers (in some embodiments, in a range from 1 micrometer to 25 micrometers, or even 2 micrometers to 15 micrometers).

19C. The method of any preceding C Exemplary Embodiment further comprising a tie layer disposed between the first major surface of the polymeric substrate and the plurality of particles.

20C. The method of Exemplary Embodiment 19C, wherein the tie layer is a continuous layer.

21C. The method of Exemplary Embodiment 19C, wherein the tie layer is a discontinuous layer.

22C. The method of any preceding C Exemplary Embodiment, wherein the particles have thickness no greater than 300 nm (in some embodiments, no greater than 250 nm, 200 nm, or even no greater than 150 nm; in some embodiments, in a range from 100 nm to 200 nm).

23C. The method of any preceding C Exemplary Embodiment, wherein the ratio of the particle width to the particle thickness is at least greater than 2:1 (in some embodiments, at least greater than 3:1, 4;1, 5:1, 10:1, 15:1, 20:1, 25:1, 50:1, 75:1, or even at least greater than 100:1).

24C. The method of any preceding C Exemplary Embodiment further comprising a disposing a dielectric layer between the plurality of particles and plasmonic material.

25C. The article of Exemplary Embodiment 24C, wherein the dielectric layer comprises at least one of an oxide, a carbide, a nitride, a chalcogenide, or a polymer.

26C. The method of either Exemplary Embodiment 24C or 25C, wherein the dielectric layer is a continuous layer.

27C. The article of either Exemplary Embodiment 24C or 25C, wherein the dielectric layer is a discontinuous layer.

1D. A method of curling particles, the method comprising:
applying a plurality of two-dimensional particles (e.g., at least one of clay (including vermiculite) particles, glass particles, boron nitride particles, carbon particles, molybdenum disulfide particles, or bismuth oxychloride particles) to a major surface of a polymeric substrate (e.g., heat shrinkable film, elastomeric film, elastomeric fibers, or heat shrinkable tubing) to provide a coating on the major surface of the polymeric substrate, the coating comprising the plurality of particles;

dimensionally relaxing (e.g., via heating, via removing tension) the coated polymeric substrate, the particles each having an outer surface, whereupon relaxing, for at least 50 percent (in some embodiments, 55, 60, 65, 70, 75, 80, 85, 90, or even at least 95 percent) by number of the particles there is at least 20 (in some embodiments, at least 25, 30, 35, 40, 45, 50, 55, 60, 65, 70, 75, 80, 85, 90, or even at least 95) percent of the respective particle surface area consisting of points having tangential angles changing at least greater than 5 (in some embodiments, at least greater than 10, 15, 20, 25, 30, 35, 40, 45, 50, 55, 60, 65, 70, 75, 80, or even at least greater than 85) degrees away from the major surface of the polymeric substrate, the particles having a collective outer surface; and depositing and a layer comprising plasmonic material (e.g., at least one of gold, silver, copper, platinum, ruthenium, nickel, palladium, rhodium, iridium, chromium, aluminum, iron, lead, tin, zinc, a combination thereof (e.g., layers of, or co-deposited, platinum and ruthenium), or alloy thereof (e.g., Pt—Fe alloys)) on at least a portion of the collective outer surface. The particles can be planar or non-planar.

2D. The method of Exemplary Embodiment 1D, the particles have an aspect ratio of at least greater than 3:1 (in some embodiments, at least greater than 4:1, 5:1, 10:1, 15:1, 20:1, 25:1, 50:1, 75:1, 100:1, 250:1, 500:1, 750:1 or even at least greater than 1000:1).

3D. The method of any preceding D Exemplary Embodiment, wherein the two-dimensional particles comprise a dielectric material.

4D. The method of any preceding D Exemplary Embodiment, wherein the plasmonic material is a plasmonic material in at least one wavelength in the ultraviolet wavelength range.

5D. The method of Exemplary Embodiment 4D, wherein the plasmonic material is at least one of palladium, nickel, rhodium, chromium, aluminum, zinc, a combination thereof, or an alloy thereof.

6D. The method of any preceding D Exemplary Embodiment, wherein the plasmonic material is a plasmonic material in at least one wavelength in the visible wavelength range.

7D. The method of Exemplary Embodiment 6D, wherein the plasmonic material is at least one of gold, silver, copper, chromium, aluminum, palladium, rhodium, nickel, zinc, iron, a combination thereof, or an alloy thereof.

8D. The method of any preceding D Exemplary Embodiment, wherein the plasmonic material is a plasmonic material in at least one wavelength in the infrared wavelength range.

9D. The method of Exemplary Embodiment 8D, wherein the plasmonic material is at least one of silver, copper, gold, tin, lead, iron, platinum, ruthenium, nickel, palladium, rhodium, iridium, a combination thereof, or an alloy thereof.

10D. The method of any preceding D Exemplary Embodiment, wherein the layer comprising plasmonic material has a planar equivalent thickness of at least 10 nm (in some embodiments, at least 15 nm, 20 nm, 25 nm, 30 nm, 40 nm, 50 nm, 100 nm, 200 nm, 250 nm, or even at least 300 nm or more; in some embodiments, in a range from 25 nm to 300 nm, 25 nm to 250 nm, 30 nm to 200 nm, 30 nm to 150 nm, 40 nm to 200 nm, or even 40 nm to 150 nm).

11D. The method of any of Exemplary Embodiments 1D to 9D, wherein the layer comprising plasmonic material comprises gold having a planar equivalent thickness of at least 10 nm (in some embodiments, at least 15 nm, 20 nm, 25 nm, 30 nm, 40 nm, or even at least 50 nm; in some embodiments, in a range from 25 nm to 250 nm, 30 nm to 200 nm, 30 nm to 150 nm, 40 nm to 200 nm, or even 40 nm to 150 nm).

12D. The method of any of Exemplary Embodiments 1D to 9D, wherein the layer comprising plasmonic material comprises silver having a planar equivalent thickness of at least at least 10 nm (in some embodiments, at least 15 nm, 20 nm, 25 nm, 30 nm, 40 nm, 50 nm, 100 nm, 200 nm, 250 nm, or even at least 300 nm or more).

13D. The method of any of Exemplary Embodiments 1D to 9D, wherein the layer comprising plasmonic material other than gold having a planar equivalent thickness of at least 10 nm (in some embodiments, at least 15 nm, 20 nm, 25 nm, 30 nm, 40 nm, 50 nm, 75 nm, 100 nm, 150 nm, 200 nm, 250 nm, or even at least 300 nm or more; in some embodiments, in a range from 25 nm to 300 nm, 25 nm to 250 nm, 30 nm to 200 nm, 30 nm to 150 nm, 40 nm to 200 nm, or even 40 nm to 150 nm).

14D. The method of any preceding D Exemplary Embodiment, wherein the layer comprising plasmonic material is continuous.

15D. The method of any of Exemplary Embodiments 1D to 13D, wherein the layer comprising plasmonic material is discontinuous.

16D. The method of any preceding D Exemplary Embodiment, wherein the particles have thickness no greater than 300 nm (in some embodiments, no greater than 250 nm, 200 nm, or even no greater than 150 nm; in some embodiments, in a range from 100 nm to 200 nm).

17D. The method of any preceding D Exemplary Embodiment, wherein the coated polymeric substrate has an original length and is dimensionally relaxed in at least one dimension by at least 20 (in some embodiments, at least 25, 30, 40, 50, 60, 70, or even at least 80) percent of the original length.

18D. The method of any preceding D Exemplary Embodiment, wherein the particles have a largest dimension in a range from 1 micrometer to 50 micrometers (in some embodiments, in a range from 1 micrometer to 25 micrometers, or even 2 micrometers to 15 micrometers).

19D. The method of any preceding D Exemplary Embodiment further comprising a tie layer disposed between the first major surface of the polymeric substrate and the plurality of particles.

20D. The method of Exemplary Embodiment 19D, wherein the tie layer is a continuous layer.

21D. The method of Exemplary Embodiment 19D, wherein the tie layer is a discontinuous layer.

22D. The method of any preceding D Exemplary Embodiment, wherein the particles have thickness no greater than 300 nm (in some embodiments, no greater than 250 nm, 200 nm, or even no greater than 150 nm; in some embodiments, in a range from 100 nm to 200 nm).

23D. The method of any preceding D Exemplary Embodiment, wherein the ratio of the particle width to the particle thickness is at least greater than 2:1 (in some embodiments, at least greater than 3:1, 4:1, 5:1, 10:1, 15:1, 20:1, 25:1, 50:1, 75:1, or even at least greater than 100:1).

24D. The method of any preceding D Exemplary Embodiment, wherein the particles have an aspect ratio of at least greater than 2:1 (in some embodiments, at least greater than 3:1, 4:1, 5:1, 10:1, 15:1, 20:1, 25:1, 50:1, 75:1, 100:1, 250:1, 500:1, 750:1, or even at least greater than 1000:1).

25D. The method of any preceding D Exemplary Embodiment further comprising a disposing a dielectric layer between the plurality of particles and plasmonic material.

26D. The article of Exemplary Embodiment 25D, wherein the dielectric layer comprises at least one of an oxide, a carbide, a nitride, a chalcogenide, or a polymer.

27D. The method of either Exemplary Embodiment 25D or 26D, wherein the dielectric layer is a continuous layer.

28D. The article of either Exemplary Embodiment 25D or 26D, wherein the dielectric layer is a discontinuous layer.

1E. A kit comprising:
an article described herein; and
instructions to use the article for spectroscopically (e.g., surface-enhanced Raman scattering, surface-enhanced fluorescence, or surface-enhanced infrared absorption) identifying the presence of an analyte.

1F. A method of spectroscopically identifying the presence of analyte comprising:
adsorbing analyte of interest to an article described herein;
irradiating the adsorbed analyte with electromagnetic radiation (e.g., via a laser);
obtaining at least one of an electromagnetic scattering spectrum, an electromagnetic reflection spectrum, an electromagnetic emission spectrum, or an electromagnetic absorption spectrum of the irradiated, adsorbed analyte; and
interpreting the spectrum to identify the respective electromagnetic scattering, electromagnetic reflection, electromagnetic emission, or electromagnetic absorption characteristics of the irradiated, adsorbed analyte. For example, the presence of a set of characteristic Raman scattering bands from an analyte can indicate the presence, or even the quantity, of the analyte in the sample volume.

Advantages and embodiments of this invention are further illustrated by the following examples, but the particular materials and amounts thereof recited in these examples, as well as other conditions and details, should not be construed to unduly limit this invention. All parts and percentages are by weight unless otherwise indicated.

Materials erwise noted in the following Examples (e.g., where pressure sensitive adhesive (PSA) coatings might be applied prior to particle coating).

In the case of heat shrink film substrates, the films in their "strained state" were taped using a transparent tape (obtained from 3M Company under trade designation "3M SCOTCH 600 TRANSPARENT TAPE") along each edge onto an aluminum metal plate such that a smaller exposed region of the base substrate was available for coating of the particles. In some examples, an adhesive tie layer coating was first applied to the dimensionally relaxable substrate prior to particle coating.

The edge-taped substrates were then lightly coated with a sprinkling of an excess amount of particles. The type of particles used are described in each of the following examples, and are collectively referred to as "coating particle" or "coating particles." Excess amount of particles, in this context, refers to an amount that produces uncoated particles after the polishing process. The coating particles were then polished onto the entire exposed region of the substrates using a foam pad-based polishing tool (obtained from Meguiar's Inc., Irvine, Calif., under the trade designation "MEGUIAR'S G3500 DA POWER SYSTEM TOOL) and polishing pads (obtained from Meguiar's Inc. under the trade designation "G3509 DA WAXING POWER PADS") attached to a drill press (obtained from WEN Products, Elgin, Ill., under the trade designation "WEN 4210 10-INCH DRILL PRESS WITH CROSSHAIR LASER"). The particles were polished onto the substrate for a total of about 120 seconds at a main shaft speed of about 1700

| Designation | Description |
| --- | --- |
| PO heat shrink film | Polyolefin (PO) heat shrink film, 75 gauge, shrink ratio 4~5:1, (obtained from Sealed Air, Elmwood Park, NJ, under trade designation "CRYOVAC D-955") |
| PS heat shrink film | Polystyrene (PS) heat shrink film, Grafix KSF50-C, clear (obtained from Grafix, Maple Heights, OH) |
| Glass slide | Micro cover glass (Cat Number 48366 205, obtained from VWR, Radnor, PA) |
| Boron Nitride (1 micrometer) | Boron nitride (~1 micrometer particle size; 99%, Lot#: 13422DG; obtained from Aldrich Chemical Co., Inc., Milwaukee, WI) |
| Boron Nitride (7 micrometers) | Boron nitride (~7 micrometer particle size; obtained from 3M Company, St. Paul, MN, under trade designation "3M BORON NITRIDE COOLING FILLER PLATELETS 007") |
| Boron Nitride (15 micrometers) | Boron nitride (~15 micrometer particle size; obtained from 3M Company under trade designation "3M BORON NITRIDE COOLING FILLER PLATELETS 015") |
| BiOCl | Bismuth oxychloride (Stock# 17102; obtained from Alfa Inorganics, Beverly, MA) |
| $MoS_2$ | 100% $MoS_2$ powder (Lot#: 0130437924; obtained from Dow Corning Corp., Midland, MI, under trade designation "MOLYKOTE Z") |
| Mica | Mica powder (>98%, <15 micrometers particle size; Lot#07220801; obtained from MakingCosmetics Inc., Snoqualmie, WA) |
| Glass flake | Glass flake powder (<50 micrometer, Batch No. 174; obtained from Glass Flake Ltd., Leeds, West Yorkshire, UK, under trade designation "ECR GLASSFLAKE GF001") |
| Vermiculite | Vermiculite powder (Lot # 5396-0; obtained from Specialty Vermiculite Corp., Enoree, SC, under trade designation "MICROLITE POWDER VERMICULITE DISPERSION") |
| Ethylene-vinyl acetate copolymer resin | Ethylene-vinyl acetate copolymer resin (Lot # 60330004; obtained from DuPont, Wilmington, DE, under trade designation, "DUPONT ELVAX 40L-03") |

Methods

Method for Polishing of Particles on Substrates

The polymeric substrates used in the following examples possessed a dimensionally "strained state" (e.g., prestretched state for heat shrink substrate) and dimensionally "relaxed state" (e.g., state after heating for heat shrink substrate). All substrates were used as-received unless othrotations per minute (RPM). Compressed air was used to remove residual, uncoated particles prior to removal of the tape at each edge of the film.

Method for Dimensionally Relaxing Coated Substrates

The coated films were placed (coated side up) between two polytetrafluoroethylene (PTFE) mesh screens and placed in a preheated oven at 150° C. (air temperature) for 2 minutes (for PO heat shrink film) or 3 minutes (PS heat shrink film) before rapidly removing and cooling to about 40° C. within 1 minute. The shrunken samples were notably thicker, while simultaneously smaller in the long dimensions (the extent depending on the shrink ratio of the specific substrate films used). The shrink ratio was determined by dividing the length of the shrinking/relaxing dimension of the "dimensionally relaxable" base substrate (e.g., width or length in the case of PO heat shrink film) before shrinking by the length of the same dimension after shrinking. For lower shrink ratio (~2:1), the oven temperature was set to 117° C.

Method for Applying Adhesive Tie Layer

For one of the examples below, an ethylene-vinyl acetate copolymer resin ("DUPONT ELVAX 40L-03") coating was prepared on PO heat shrink film prior to coating of the particles. A solution of ~10 wt. % solids was prepared in toluene and coated onto the PO film using a wire wound rod #4 (0.4 mil wet film thickness). The wet film coated substrate was allowed to dry in heated air at 50° C. for about 2.6 minutes. The resulting coated film is referred to as "PO heat shrink film/ethylene-vinyl acetate copolymer resin ("DUPONT ELVAX 40L-03")" for the following examples.

Method for Scanning Electron Microscopy

Images were obtained using a scanning electron microscope (SEM) (obtained from JEOL Inc., Tokyo, Japan, under the trade designation "JEOL BENCH TOP SEM"). A 45° angle mount (obtained from Ted Pella, Inc., Redding, Calif., under trade designation "PELCO SEMCLIP 45/90° MOUNT" (#16357-20)) was used for mounting samples in the SEM. A small piece of conductive carbon tape (obtained from 3M Company under trade designation "3M TYPE 9712 XYZ AXIS ELECTRICALLY CONDUCTIVE DOUBLE SIDED TAPE") was placed at the top of the 45° angle surface of the mount, and samples were mounted by affixing a small piece of the film/tube onto the carbon tape. If possible, the sample piece was situated as close to the top edge of the 45° angle surface as possible. A small amount of silver paint (obtained from Ted Pella, Inc., Redding, Calif., under trade designation "PELCO CONDUCTIVE LIQUID SILVER PAINT" (#16034)) was then applied to a small region of each sample piece, and extended to contact either the carbon tape, aluminum mount surface or both. After briefly allowing the paint to air dry at room temperature, the mounted sample assembly was placed into a sputter/etch unit (obtained from Denton Vacuum, Inc., Moorestown, N.J., under the trade designation "DENTON VACUMM DESK V") and the chamber evacuated to ~0.04 Torr. Argon gas was then introduced into the sputtering chamber until the pressure stabilized at ~0.06 Torr before initiating the plasma and sputter coating gold onto the assembly for 120 seconds at ~30 mA.

Method for Deposition of Silver or Gold

The silver or gold layers were deposited on the substrates within an ultra-low vacuum "e-beam evaporation" chamber. This chamber was obtained from the Kurt J. Lesker Company, Jefferson Hills, Pa. The samples were held down with a Kapton tape (obtained from 3M Company under trade designation "3M POLYIMIDE FILM TAPE 5413") onto a 10 inch×10 inch (25 cm×25 cm) metal plate and placed face down in the load lock chamber (deposition is from the lower part of the main chamber and the sample is about 45 cm (18 inches) above the source material). The load lock was pumped down to $<1\times10^{-5}$ torr ($1.33\times10^{-3}$ Pa), then the plate was moved into the main chamber. The main chamber pressure was in the range $<3\times10^{-6}$ torr ($8\times10^{-4}$ Pa).

The deposition was carried out by turning on the power supply and the source and controller gauges. The rate of deposition was controlled by a controller (obtained from Inficon, East Syracuse, N.Y., under the trade designation "INFICON XTC/2 THIN FILM DEPOSITION CONTROLLER") at a rate of 0.1 nm per second (using software) until certain thickness of metal was deposited. The thickness of metal layer, as noted in the Examples and Comparative Examples, is the planar equivalent thickness of the metal. The thickness was monitored by a 6 MHz Au coated quartz crystal thickness monitor (obtained from Inficon) connected to the XTC/2 controller with a feedback loop. The power supply was shut down once the target thickness was reached. The sample was then transferred back to the load-lock chamber and evacuated and the samples were removed from the plate.

The type of metals used are described in each of the following examples, and are collectively referred to as "coating metal" or "coating metals."

Measurement of Raman Spectra

The surface enhanced Raman scattering (SERS) activity was investigated by applying a small amount of 1-2-bis(4-pyridyl)ethylene (BPE) (obtained from Sigma Aldrich, St. Louis, Mo.) to each of the substrates (about 5 mm×5 mm in size). Various concentrations of 1-2-bis(4-pyridyl)ethylene ("BPE") solutions were prepared in methanol (HR-GC grade, obtained from EMD Chemicals, Gibbstown, N.J.). In each case, 2 microliters or 4 microliters of the 1-2-bis(4-pyridyl) ethylene ("BPE") solutions were applied to the substrate and allowed to dry in air for at least 2 minutes at 22° C. Raman spectra of the coated substrates were then acquired using a confocal Raman microscope (obtained under a trade designation "RENISHAW INVIA" from Renishaw, Gloucestershire, UK) with a 785-nm diode laser focused through a 50×/0.75NA objective or a Raman microscope (obtained under the trade designation "SNOWY RANGE IM-52" from Metrohm Raman, Laramie, Wyo.) with a 785-nm diode laser focused through a 40× objective.

In the case of the confocal Raman microscope ("RENISHAW INVIA"), neutral density filters were used to attenuate a 300-mW laser beam to 0.3 mW, with an optical throughput of the entire system (~33%) further attenuating beam to ~0.1 mW before focusing on the sample. Scattered light from the sample was filtered by an edge filter to remove the laser line and imaged onto a grating/charge-coupled device (CCD) spectrometer with ~1 $cm^{-1}$ resolution. In the case of the Raman microscope ("SNOWY RANGE IM-52"), a laser power between 1.8~3.5 mW was used. The spectral resolution was 1 $cm^{-1}$ and the integration time was 1 second. Three spectra were taken at each sample and average values of integrated peak intensity were obtained. Integrated peak intensities were obtained using a customized program (software obtained under the trade designation "LABVIEW" from National Instruments Corp., Austin, Tex.).

Comparative Examples 1-5 (CE1-CE5, Respectively)

CE1-CE5 were prepared from various silver coated flat surfaces (glass slide, PO heat shrink film, and PS heat shrink film). Unless otherwise noted, all Examples had the coating metal deposited onto shrunken substrates. For CE4 and CE5, silver coating was done after shrinking. The thickness of silver was 100 nm.

Figure 4A:
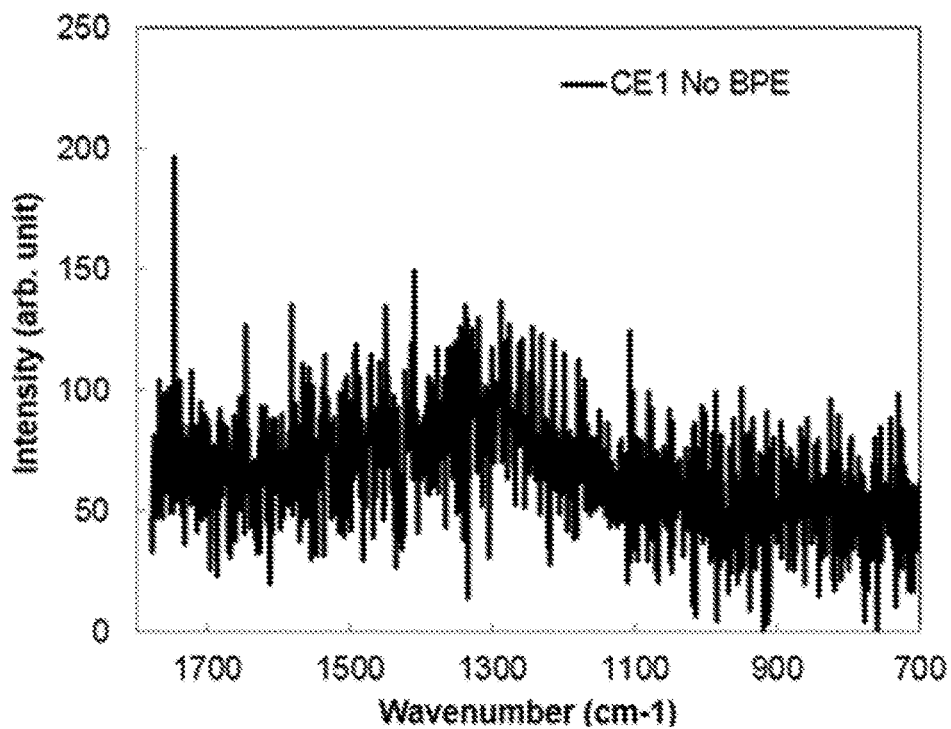
FIG. 4A is the Raman spectrum of CE1 before adding 1-2-bis(4-pyridyl)ethylene ("BPE") solution on to CE1.
Figure 4B:
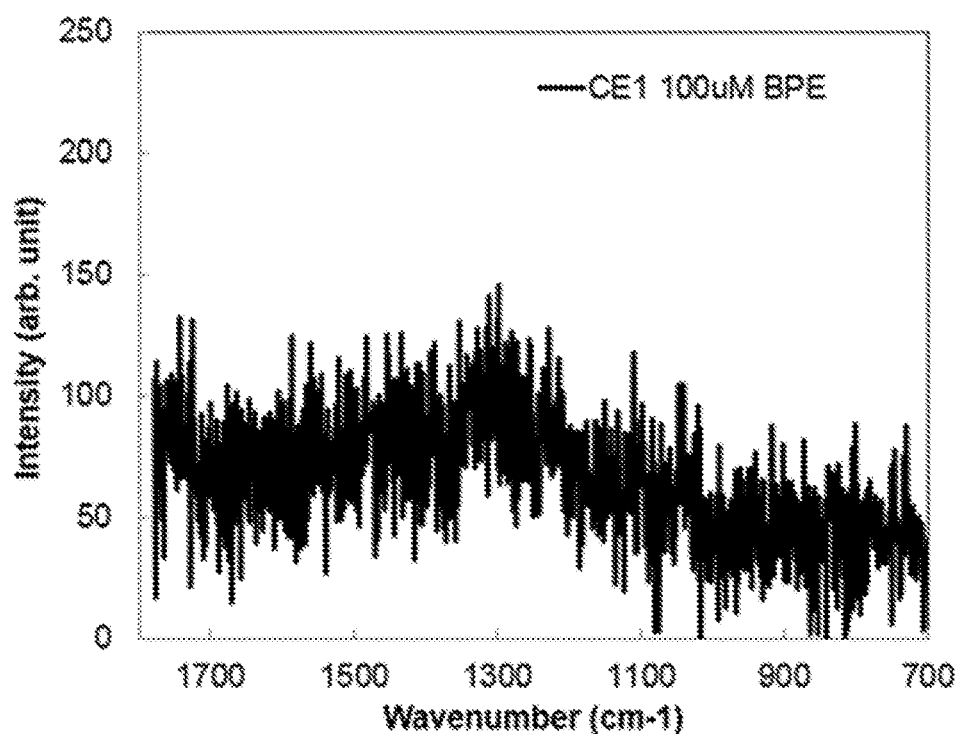
FIG. 4B is the Raman spectrum of CE1 after adding 1-2-bis(4-pyridyl)ethylene ("BPE") solution on to CE1 and dried.

FIGS. 4A and 4B shows Raman spectra before and after, respectively, adding 2 microliters of 100 microM BPE solution onto CE1 and being allowed to dry in air for at least 2 minutes at 22° C. No discernable SERS signals from BPE were observed on CE1. No discernable SERS signals from 1-2-bis(4-pyridyl)ethylene ("BPE") were observed on CE2-CE5 after adding 2 microliters of 100 microM 1-2-bis(4-pyridyl)ethylene ("BPE") solution onto each example (see Table 1, below).

TABLE 1

| Example | Substrate | Coating Particle | Coating Metal | Shrink Temp, ° C. | Heat Time, minutes | Shrink ratio | SERS Signals from 100 microM 1-2-bis(4-pyridyl)ethylene ("BPE"), 2 microliters |
|---|---|---|---|---|---|---|---|
| CE1 | Glass slide | N/A | Silver | N/A | N/A | N/A | No |
| CE2 | PO heat shrink film | N/A | Silver | 150 | 2 | 4.65:1 | No |
| CE3 | PS heat shrink film | N/A | Silver | 150 | 3 | 2.47:1 | No |
| CE4 | PO heat shrink film | N/A | Silver | N/A | N/A | N/A | No |
| CE5 | PS heat shrink film | N/A | Silver | N/A | N/A | N/A | No |

Comparative Example 6 and Examples 1 and 2 (CE6 and EX1 and EX2, Respectively)

CE6, EX1, and EX2 samples were prepared by coating particles onto substrates in their "dimensionally strained" states and then dimensionally relaxing them using the "Method for Dimensionally Relaxing Coated Substrates" described above, followed by silver deposition. The thickness of silver deposition was 100 nm. Once the substrates were dimensionally relaxed, the resulting substrates with coatings thereon were examined using the SEM as described above. Table 2, below, summarizes the substrates, coating particles, baking conditions, and measured shrink ratio used for preparing CE6, and EX1 and EX2 samples.

substrate after dimensionally relaxing and reducing the length and width of the substrate by 78% of the original length and width of the substrate.

Figure 8:
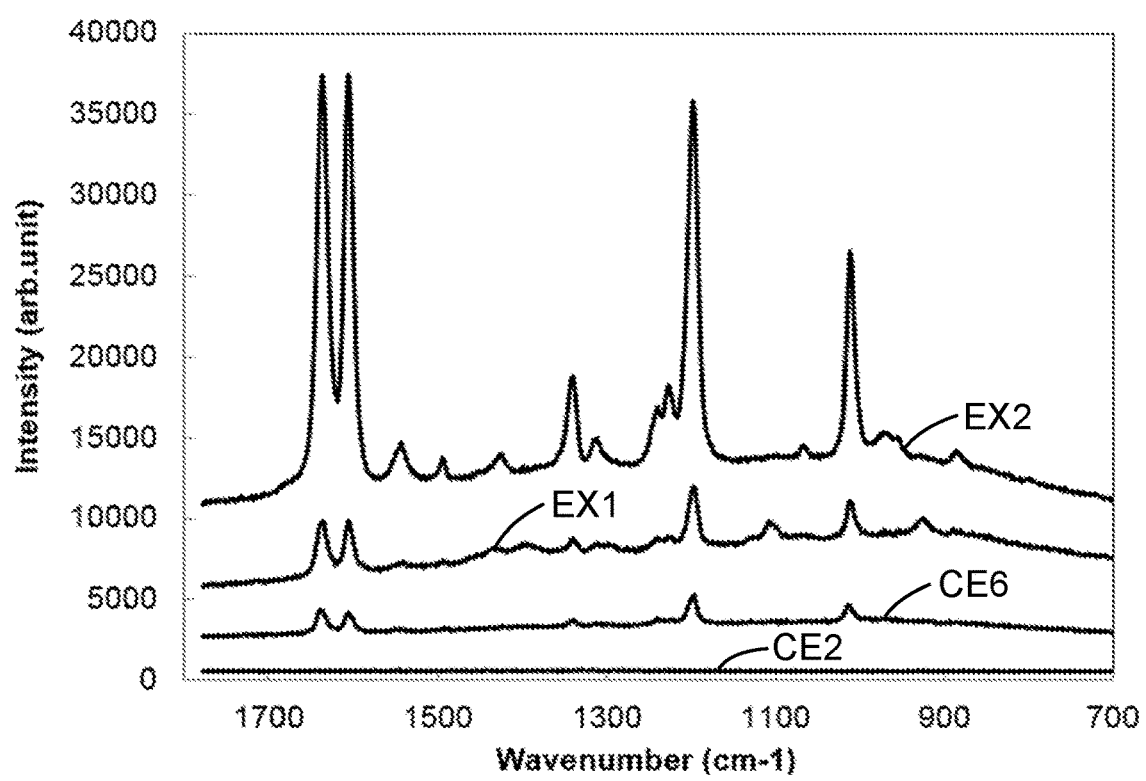
FIG. 8 shows Raman spectra of CE2, CE6, EX1, and EX2 after adding 1-2-bis(4-pyridyl)ethylene ("BPE") solution on to CE2, CE6, EX1, and EX2, respectively.

FIG. 8 shows Raman spectra after adding 2 microliters of 100 microM 1-2-bis(4-pyridyl)ethylene ("BPE") solution onto CE2, CE6, EX1, and EX2 and being allowed to dry in air for at least 2 minutes at 22° C. For this set of spectra, confocal Raman microscope (obtained under the trade designation "INVIA" from Renishaw) was used and all measurement parameters (objective, laser power, spectral resolution, and integration time) were the same. Offsets were used for clarification. No discernable SERS signals from 1-2-bis(4-pyridyl)ethylene ("BPE") were observed on EX2. Discernable SERS signals from 1-2-bis(4-pyridyl)ethylene ("BPE") were observed on CE6, EX1, and EX2. The main bands of 1-2-bis(4-pyridyl)ethylene ("BPE") appear at 1639, 1610, and 1200 cm$^{-1}$, respectively. The Raman band at 1200 cm$^{-1}$ was used for monitoring 1-2-bis(4-pyridyl)ethylene ("BPE") detection ability of SERS active substrates.

Figure 9:
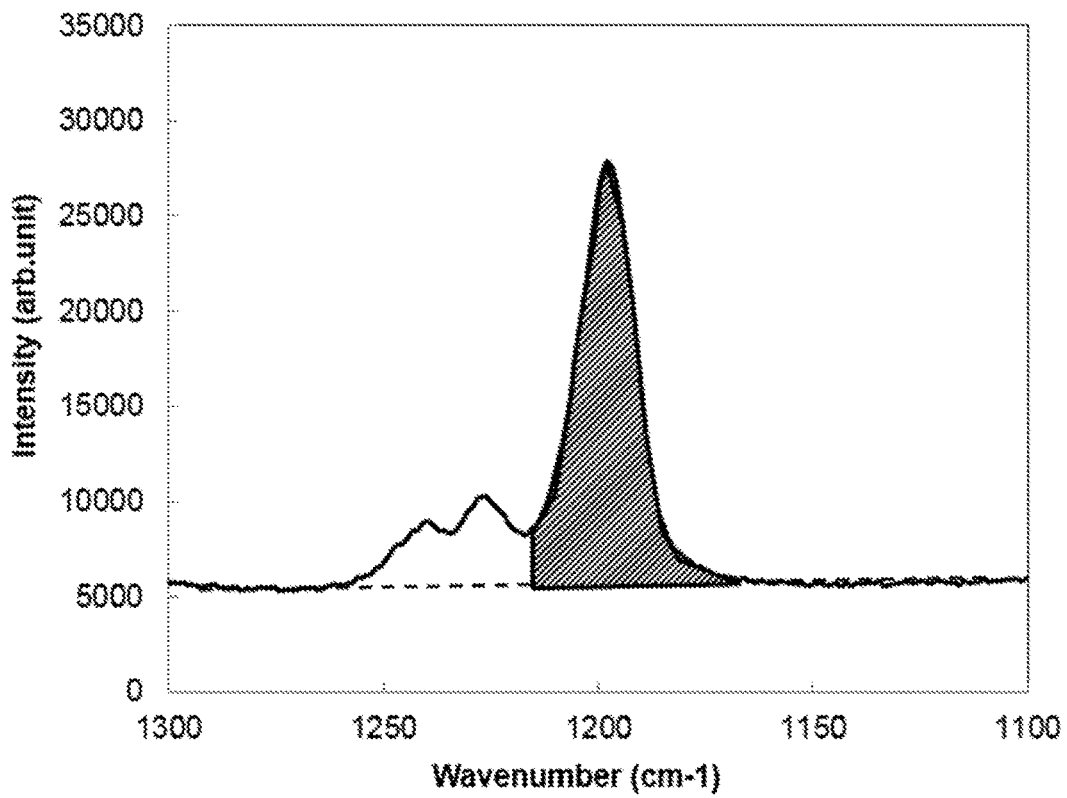
FIG. 9 shows measurement of integrated intensity of the peak centered at 1200 cm$^{-1}$ (patterned filled area) with the baseline shown as a dashed line.

FIG. 9 shows measurement of integrated intensity for the Raman band at 1200 cm$^{-1}$ (patterned filled area) with a

TABLE 2

| Example | Substrate | Coating Particle | Coating Metal | Shrink Temp., ° C. | Heat Time, minutes | Shrink ratio | Integrated Intensity at 1200 cm$^{-1}$ from 100 microM 1-2-bis(4-pyridyl)ethylene ("BPE"), 2 microliters |
|---|---|---|---|---|---|---|---|
| CE6 | PO heat shrink film | BiOCl | Silver | N/A | N/A | N/A | 22415 |
| EX1 | PO heat shrink film | BiOCl | Silver | 117 | 2 | 2.14:1 | 62709 |
| EX2 | PO heat shrink film | BiOCl | Silver | 150 | 2 | 4.64:1 | 386058 |

Figure 5:
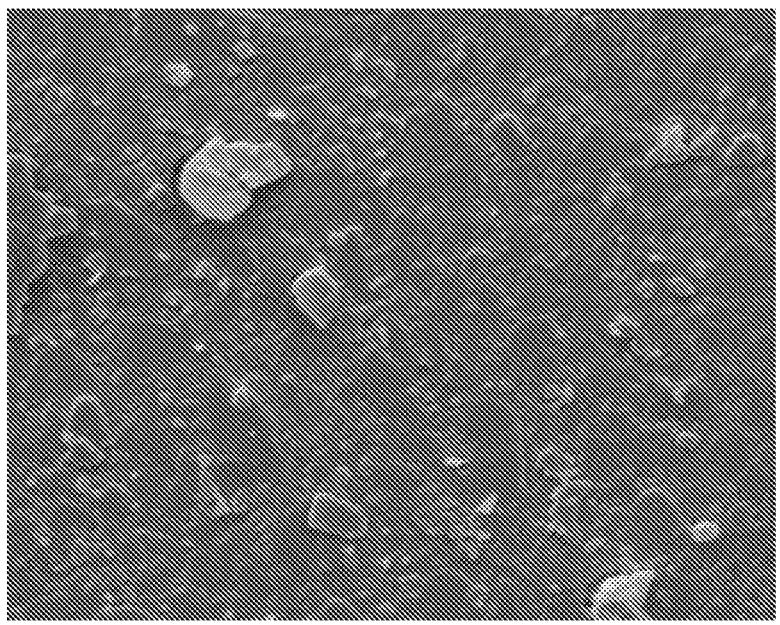
FIG. 5 is a scanning electron microscopy (SEM) image at 5000× of a plan view above the particle coating of CE6 prior to dimensionally relaxing (heating).

FIG. 5 is an SEM image at 5000× magnification of CE6 without dimensionally relaxing. For CE6, coated particles on the substrate had basal planes oriented along the first major surface of the substrate.

Figure 6:
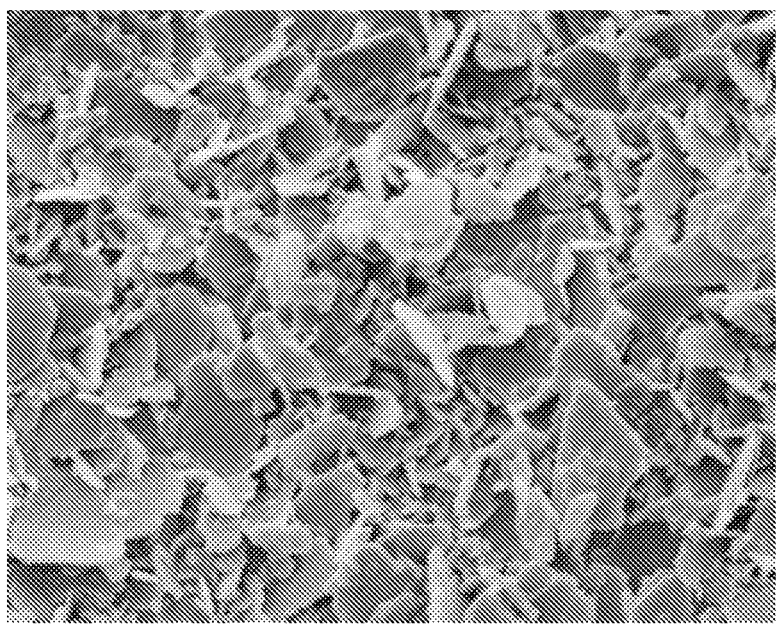
FIG. 6 is an SEM image at 5000× of a plan view above the particle coating of EX1 after dimensionally relaxing (heating).

FIG. 6 is an SEM image at 5000× magnification of EX1 after dimensionally relaxing (heating). For EX1, a majority of the particles coated on the substrate had basal planes oriented at an angle relative to the first major surface of the substrate after dimensionally relaxing and reducing the length and width of the substrate by 53% of the original length and width of the substrate.

Figure 7:
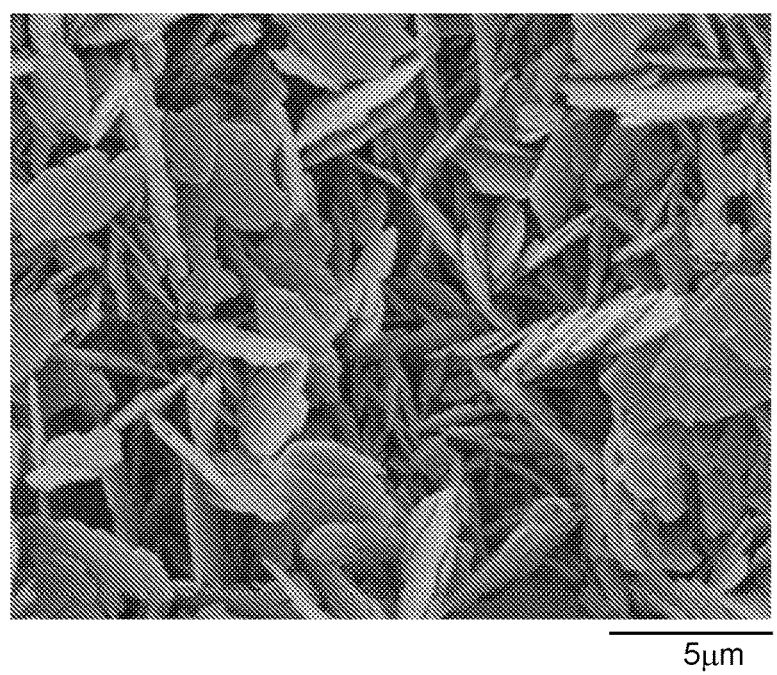
FIG. 7 is an SEM image at 5000× of a plan view above the particle coating of EX2 after dimensionally relaxing.

FIG. 7 is an SEM image at 5000× magnification of EX2 after dimensionally relaxing (heating). For EX2, a majority of the particles coated on the substrate had basal planes oriented at an angle relative to the first major surface of the dotted based line at 1200 cm$^{-1}$. Table 2 (above) shows measured integrated intensity at 1200 cm$^{-1}$ for CE6, EX1, and EX2.

Example 3 (EX3)

EX3 sample was prepared by coating particles onto substrates in their "dimensionally strained" states and then dimensionally relaxing them using the "Method for Dimensionally Relaxing Coated Substrates" described above, followed by silver deposition. The thickness of silver deposition was 100 nm. Table 3, below, summarizes the substrates, coating particles, baking conditions, and measured shrink ratio used for preparing EX3 sample.

TABLE 3

| Example | Substrate | Coating Particle | Coating Metal | Shrink Temp., °C. | Heat Time, minutes | Shrink ratio | Integrated Intensity at 1200 cm$^{-1}$ from 100 microM 1-2-bis(4-pyridyl)ethylene ("BPE"), 2 microliters |
|---|---|---|---|---|---|---|---|
| EX3 | PO heat shrink film | Mica | Silver | 150 | 2 | 3.94:1 | 85585 |

Figure 10:
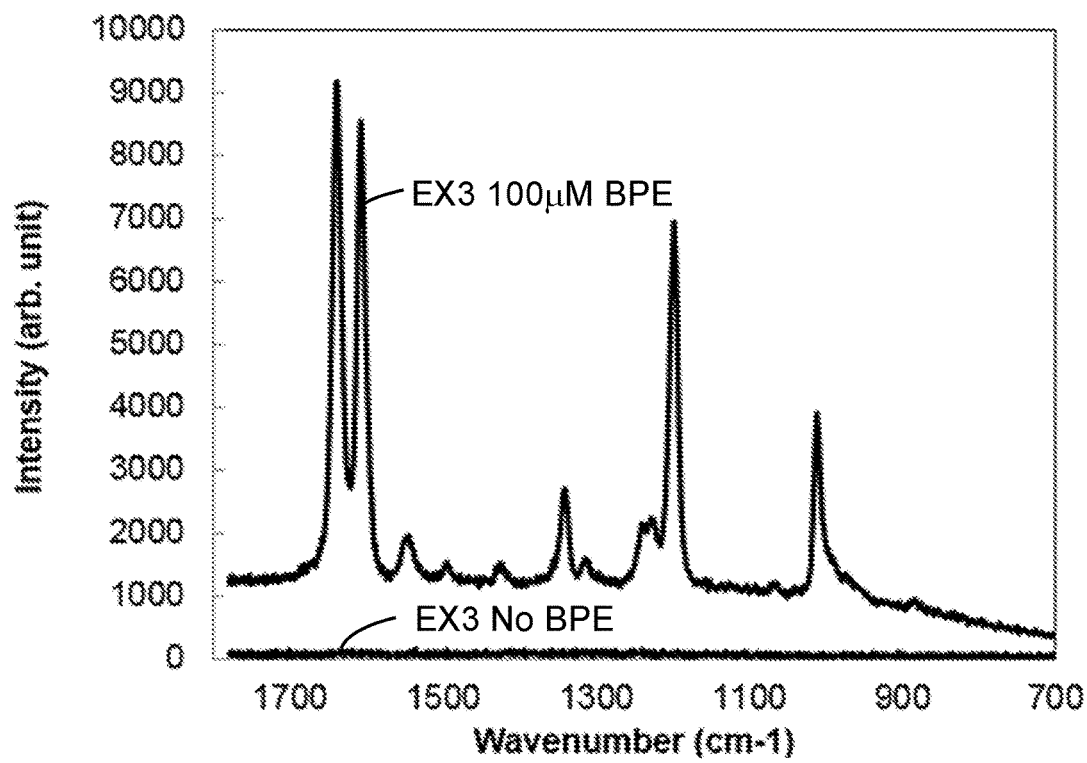
FIG. 10 shows the Raman spectra of EX3 before and after adding 1-2-bis(4-pyridyl)ethylene ("BPE") solution on to EX3.

FIG. 10 shows Raman spectra before and after adding 2 microliters of 100 microM 1-2-bis(4-pyridyl)ethylene ("BPE") solution onto EX3 and being allowed to dry in air for at least 2 minutes at 22° C. For this set of spectra, the confocal Raman microscope ("INVIA") was used and all measurement parameters (objective, laser power, spectral resolution, and integration time) were the same.

Comparative Examples 7 and 8 and Examples 4-7 (CE7, CE8, and EX4-EX7, Respectively)

EX4-EX7 samples were prepared by coating particles onto substrates in their "dimensionally strained" states and then dimensionally relaxing them using the "Method for Dimensionally Relaxing Coated Substrates" described above, followed by gold deposition. The thickness of gold deposition was 100 nm. CE7 and CE8 are comparative examples with no gold deposition and no particles, respectively. Raman spectra were obtained after adding 2 microliters of 100 microM 1-2-bis(4-pyridyl)ethylene ("BPE") onto CE7, CE8, and EX4-EX7 and being allowed to dry in air for at least 2 minutes at 22° C. Table 4, below, summarizes the substrates, coating particles, baking conditions, and measured shrink ratio, and integrated intensity at 1200 cm$^{-1}$ from 2 microliters of 100 microM 1-2-bis(4-pyridyl)ethylene ("BPE").

TABLE 4

| Example | Substrate | Coating Particle | Coating Metal | Shrink Temp., °C. | Heat Time, minutes | Shrink ratio | Integrated Intensity at 1200 cm$^{-1}$ from 100 microM 1-2-bis(4-pyridyl)ethylene ("BPE"), 2 microliters |
|---|---|---|---|---|---|---|---|
| CE7 | PO heat shrink film | BiOCl | None | 150 | 2 | 5.12:1 | No |
| CE8 | Glass slide | None | Gold | N/A | N/A | N/A | 3608 |
| EX4 | PO heat shrink film | Mica | Gold | 150 | 2 | 3.94:1 | 381408 |
| EX5 | PO heat shrink film | Boron Nitride (15 micrometers) | Gold | 150 | 2 | 4.98:1 | 464739 |
| EX6 | PO heat shrink film | Boron Nitride (1 micrometer) | Gold | 150 | 2 | 3.86:1 | 525265 |
| EX7 | PO heat shrink film | BiOCl | Gold | 150 | 2 | 4.14:1 | 910637 |

For this set of spectra, the confocal Raman microscope ("RENISHAW INVIA") was used and all measurement parameters (objective, laser power, spectral resolution, and integration time) were the same.

Examples 8-14 (EX8-EX14, Respectively)

EX8-EX14 samples were prepared by coating particles onto substrates in their "dimensionally strained" states and then dimensionally relaxing them using the methods described above by followed by gold deposition. The thickness of gold deposition was 100 nm. The baking condition was 150° C. for 2 minutes. Raman spectra were obtained after adding 2 microliters of various concentration of 1-2-bis(4-pyridyl)ethylene ("BPE") solution onto EX8-EX14 and being allowed to dry in air for at least 2 minutes at 22° C. Table 5, below, summarizes the substrates, coating particles, coating metal, measured shrink ratio, 1-2-bis(4-pyridyl)ethylene ("BPE") concentration, and integrated intensity at 1200 cm$^{-1}$ from 2 microliters of various concentration of 1-2-bis(4-pyridyl)ethylene ("BPE").

TABLE 5

| Example | Substrate | Coating Particle | Coating Metal | Shrink ratio | BPE concentration, microM, 2 microliters | Integrated Intensity at 1200 cm$^{-1}$ from 1-2-bis(4-pyridyl)ethylene ("BPE") |
|---|---|---|---|---|---|---|
| EX8 | PO heat shrink film | BiOCl | Gold | 5.12:1 | 50000 | 1604286 |
| EX9 | PO heat shrink film | BiOCl | Gold | 5.12:1 | 10000 | 1705029 |

TABLE 5-continued

| Example | Substrate | Coating Particle | Coating Metal | Shrink ratio | BPE concentration, microM, 2 microliters | Integrated Intensity at 1200 cm$^{-1}$ from 1-2-bis(4-pyridyl)ethylene ("BPE") |
|---|---|---|---|---|---|---|
| EX10 | PO heat shrink film | BiOCl | Gold | 5.12:1 | 1000 | 1567862 |
| EX11 | PO heat shrink film | BiOCl | Gold | 5.12:1 | 100 | 982935 |
| EX12 | PO heat shrink film | BiOCl | Gold | 5.12:1 | 10 | 341227 |
| EX13 | PO heat shrink film | BiOCl | Gold | 5.12:1 | 1 | 24121 |
| EX14 | PO heat shrink film | BiOCl | Gold | 5.12:1 | 0 | No |

For this set of spectra, the confocal Raman microscope ("RENISHAW INVIA") was used and all measurement parameters (objective, laser power, spectral resolution, and integration time) were the same.

Examples 15-34 (EX15-EX34, Respectively)

EX15-EX34 samples were prepared by coating particles onto substrates in their "dimensionally strained" states and then dimensionally relaxing them using the "Method for Dimensionally Relaxing Coated Substrates" described above, followed by gold deposition. The thickness of gold layer is shown in Table 6, below.

TABLE 6

| Example | Substrate | Coating Particle | Coating Metal | Gold coating thickness, nm | Shrink ratio | Integrated Intensity at 1200 cm$^{-1}$ from 10 microM 1-2-bis(4-pyridyl)ethylene ("BPE"), 4 microliters |
|---|---|---|---|---|---|---|
| EX15 | PO heat shrink film | BiOCl | Gold | 20 | 4.03:1 | 698 |
| EX16 | PO heat shrink film | BiOCl | Gold | 50 | 4.03:1 | 51521 |
| EX17 | PO heat shrink film | BiOCl | Gold | 100 | 4.03:1 | 73279 |
| EX18 | PO heat shrink film | BiOCl | Gold | 150 | 4.03:1 | 44709 |
| EX19 | PO heat shrink film | BiOCl | Gold | 200 | 5.12:1 | 20799 |
| EX20 | PO heat shrink film/ethylene-vinyl acetate copolymer resin ("DUPONT ELVAX 40L-03") | Mica | Gold | 20 | 4.49:1 | 2383 |
| EX21 | PO heat shrink film/ethylene-vinyl acetate copolymer resin ("DUPONT ELVAX 40L-03") | Mica | Gold | 50 | 4.49:1 | 5944 |
| EX22 | PO heat shrink film/ethylene-vinyl acetate copolymer resin ("DUPONT ELVAX 40L-03") | Mica | Gold | 100 | 4.49:1 | 1990 |
| EX23 | PO heat shrink film/ethylene-vinyl acetate copolymer resin ("DUPONT ELVAX 40L-03") | Mica | Gold | 150 | 4.49:1 | 1572 |
| EX24 | PO heat shrink film/ethylene-vinyl acetate copolymer resin ("DUPONT ELVAX 40L-03") | Mica | Gold | 200 | 4.49:1 | 485 |
| EX25 | PO heat shrink film | Boron Nitride (7 micrometers) | Gold | 20 | 4.11:1 | 3710 |
| EX26 | PO heat shrink film | Boron Nitride (7 micrometers) | Gold | 50 | 4.11:1 | 4118 |
| EX27 | PO heat shrink film | Boron Nitride (7 micrometers) | Gold | 100 | 4.11:1 | 9295 |
| EX28 | PO heat shrink film | Boron Nitride (7 micrometers) | Gold | 150 | 4.11:1 | 4197 |
| EX29 | PO heat shrink film | Boron Nitride (7 micrometers) | Gold | 200 | 4.11:1 | 2897 |
| EX30 | PO heat shrink film | Boron Nitride (15 micrometers) | Gold | 20 | 4.18:1 | 133 |
| EX31 | PO heat shrink film | Boron Nitride (15 micrometers) | Gold | 50 | 4.18:1 | 2632 |
| EX32 | PO heat shrink film | Boron Nitride (15 micrometers) | Gold | 100 | 4.18:1 | 2483 |

TABLE 6-continued

| Example | Substrate | Coating Particle | Coating Metal | Gold coating thickness, nm | Shrink ratio | Integrated Intensity at 1200 cm$^{-1}$ from 10 microM 1-2-bis(4-pyridyl)ethylene ("BPE"), 4 microliters |
|---|---|---|---|---|---|---|
| EX33 | PO heat shrink film | Boron Nitride (15 micrometers) | Gold | 150 | 4.18:1 | 2016 |
| EX34 | PO heat shrink film | Boron Nitride (15 micrometers) | Gold | 200 | 4.18:1 | 564 |

The baking condition was 150° C. for 2 minutes. Raman spectra were obtained after adding 4 microliters of 10 microM 1-2-bis(4-pyridyl)ethylene ("BPE") onto EX15-EX34 and being allowed to dry in air for at least 2 minutes at 22° C. Table 6 (above) summarizes the substrates, coating particles, coating metal, metal thickness, measured shrink ratio, and integrated intensity at 1200 cm$^{-1}$ from 4 microliters of 10 microM 1-2-bis(4-pyridyl)ethylene ("BPE").

For this set of spectra, Raman microscope ("SNOWY RANGE IM-52") was used and all measurement parameters (objective, laser power, spectral resolution, and integration time) were the same.

Examples 35-38 (EX35-EX38, Respectively)

EX35-EX38 samples were prepared by coating particles onto substrates in their "dimensionally strained" states and then dimensionally relaxing them using the "Method for Dimensionally Relaxing Coated Substrates" described above, followed by gold deposition. The thickness of gold layer was 100 nm. The baking condition was 150° C. for 2 minutes. Raman spectra were obtained after adding 4 microliters of 100 microM 1-2-bis(4-pyridyl)ethylene ("BPE") onto EX35-EX38 and being allowed to dry in air for at least 2 minutes at 22° C. Table 7, below, summarizes the substrates, coating particles, coating metal, measured shrink ratio, and integrated intensity at 1200 cm$^{-1}$ from 4 microliters of 100 microM 1-2-bis(4-pyridyl)ethylene ("BPE").

TABLE 7

| Example | Substrate | Coating Particle | Coating Metal | Shrink ratio | Integrated Intensity at 1200 cm$^{-1}$ from 100 microM 1-2-bis(4-pyridyl)ethylene ("BPE"), 4 microliters |
|---|---|---|---|---|---|
| EX35 | PO heat shrink film | BiOCl | Gold | 4.8:1 | 118548 |
| EX36 | PO heat shrink film | MoS$_2$ | Gold | 5.0:1 | 159360 |
| EX37 | PO heat shrink film/ ethylene-vinyl acetate copolymer resin ("DUPONT ELVAX 40L-03") | Vermiculite | Gold | 4.6:1 | 21050 |
| EX38 | PO heat shrink film/ ethylene-vinyl acetate copolymer resin ("DUPONT ELVAX 40L-03") | Glass flake | Gold | 4.8:1 | 17713 |

For this set of spectra, Raman microscope ("SNOWY RANGE IM-52") was used and all measurement parameters (objective, laser power, spectral resolution, and integration time) were the same.

Comparative Example 9 and Examples 39-46 (CE9 and EX39-EX46, Respectively)

EX39-EX46 samples were prepared by coating particles onto substrates in their "dimensionally strained" states and then dimensionally relaxing them using the methods described above by followed by silver deposition. The thickness of the deposited silver is shown in Table 8, below.

TABLE 8

| Example | Substrate | Coating Particle | Coating Metal | Silver coating thickness, nm | Shrink ratio | Integrated Intensity at 1200 cm$^{-1}$ from 1 microM 1-2-bis(4-pyridyl)ethylene ("BPE"), 4 microliters |
|---|---|---|---|---|---|---|
| CE9 | PO heat shrink film | BiOCl | N/A | N/A | 4.81:1 | No |
| EX39 | PO heat shrink film | BiOCl | Silver | 10 | 4.81:1 | 2143 |
| EX40 | PO heat shrink film | BiOCl | Silver | 20 | 4.81:1 | 3601 |

TABLE 8-continued

| Example | Substrate | Coating Particle | Coating Metal | Silver coating thickness, nm | Shrink ratio | Integrated Intensity at 1200 cm$^{-1}$ from 1 microM 1-2-bis(4-pyridyl)ethylene ("BPE"), 4 microliters |
|---|---|---|---|---|---|---|
| EX41 | PO heat shrink film | BiOCl | Silver | 30 | 4.81:1 | 6456 |
| EX42 | PO heat shrink film | BiOCl | Silver | 50 | 4.81:1 | 11797 |
| EX43 | PO heat shrink film | BiOCl | Silver | 100 | 4.81:1 | 21160 |
| EX44 | PO heat shrink film | BiOCl | Silver | 150 | 4.81:1 | 15632 |
| EX45 | PO heat shrink film | BiOCl | Silver | 200 | 4.81:1 | 16724 |
| EX46 | PO heat shrink film | BiOCl | Silver | 300 | 4.81:1 | 8835 |

For CE9, no silver was deposited. The baking condition was 150° C. for 2 minutes. Raman spectra were obtained after adding 4 micrometers of 1 microM 1-2-bis(4-pyridyl)ethylene ("BPE") onto EX47-EX53 and being allowed to dry in air for at least 2 minutes at 22° C. Table 8, below, summarizes the substrates, coating particles, coating metal, metal thickness, measured shrink ratio, and integrated intensity at 1200 cm$^{-1}$ from 4 microliters of 1 microM 1-2-bis(4-pyridyl)ethylene ("BPE").

For this set of spectra, Raman microscope (SNOWY RANGE IM-52) was used and all measurement parameters (objective, laser power, spectral resolution, and integration time) were the same.

Examples 47-53 (EX47-EX53)

EX47-EX53 samples were prepared by coating particles onto substrates in their "dimensionally strained" states and then dimensionally relaxing them using the methods described above by followed by silver and gold deposition. Initially, 50 nm of silver was deposited, followed by 50 nm of gold. The baking condition was 150° C. for 2 minutes. The shrink ratio was 4.80:1. Raman spectra were obtained after adding 4 microliters of various concentration of 1-2-bis(4-pyridyl)ethylene ("BPE") solution onto EX47-EX53 and being allowed to dry in air for at least 2 minutes at 22° C. Table 9, below, summarizes the substrates, coating particles, coating metal, 1-2-bis(4-pyridyl)ethylene ("BPE") concentration, and integrated intensity at 1200 cm$^{-1}$ from 4 microliters of various concentration of 1-2-bis(4-pyridyl)ethylene ("BPE").

For this set of spectra, Raman microscope ("SNOWY RANGE IM-52") was used and all measurement parameters (objective, laser power, spectral resolution, and integration time) were the same.

Foreseeable modifications and alterations of this disclosure will be apparent to those skilled in the art without departing from the scope and spirit of this invention. This invention should not be restricted to the embodiments that are set forth in this application for illustrative purposes.

What is claimed is:

1. An article comprising:
   a polymeric substrate having a first major surface;
   a plurality of two-dimensional particles attached to the first major surface, the plurality of two-dimensional particles having a collective outer surface; and
   a layer comprising plasmonic material on at least a portion of the collective outer surface,
   wherein for at least 50 percent by number of the two-dimensional particles there is at least 20 percent of the respective particle surface area consisting of points having tangential angles in a range from 5 to 175 degrees from the first major surface of the polymeric substrate, and
   wherein when the plasmonic material comprises gold, the plasmonic material has a planar equivalent thickness of at least 25 nm, and when the plasmonic material comprises a material other than gold, the plasmonic material has a planar equivalent thickness of at least 10 nm.

2. The article of claim 1, wherein the plasmonic material is a plasmonic material in at least one wavelength in the ultraviolet, visible, or infrared wavelength range.

TABLE 9

| Example | Substrate | Coating Particle | Coating Metals | 1-2-bis(4-pyridyl)ethylene ("BPE") concentration, microM, (4 microliters | Integrated Intensity at 1200 cm$^{-1}$ |
|---|---|---|---|---|---|
| EX47 | PO heat shrink film | BiOCl | Silver 50 nm, then Gold 50 nm | 50000 | 151058 |
| EX48 | PO heat shrink film | BiOCl | Silver 50 nm, then Gold 50 nm | 10000 | 127057 |
| EX49 | PO heat shrink film | BiOCl | Silver 50 nm, then Gold 50 nm | 1000 | 131174 |
| EX50 | PO heat shrink film | BiOCl | Silver 50 nm, then Gold 50 nm | 100 | 95013 |
| EX51 | PO heat shrink film | BiOCl | Silver 50 nm, then Gold 50 nm | 10 | 43072 |
| EX52 | PO heat shrink film | BiOCl | Silver 50 nm, then Gold 50 nm | 1 | 6626 |
| EX53 | PO heat shrink film | BiOCl | Silver 50 nm, then Gold 50 nm | 0 | No |

3. The article of claim 1, wherein the particles comprise a dielectric material.

4. The article of claim 1 further comprising a dielectric layer disposed between the plurality of particles and plasmonic material.

5. The article of claim 1, wherein the two-dimensional particles have an aspect ratio of at least greater than 10:1.

6. The article of claim 1, wherein the layer of plasmonic material consists of gold, silver, copper, platinum, ruthenium, nickel, palladium, rhodium, iridium, chromium, aluminum, iron, tin, lead, zinc, a combination thereof, or an alloy thereof.

7. An article comprising:
a polymeric substrate having a first major surface;
a tie layer on the first major surface of the polymeric substrate;
a plurality of two-dimensional particles attached to the tie layer, the plurality of two-dimensional particles having a collective outer surface; and
a layer comprising plasmonic material on at least a portion of the collective outer surface,
wherein for at least 50 percent by number of the particles there is at least 20 percent of the respective particle surface area consisting of points having tangential angles in a range from 5 to 175 degrees from the first major surface of the polymeric substrate, and
wherein when the plasmonic material comprises gold, the plasmonic material has a planar equivalent thickness of at least 25 nm, and when the plasmonic material comprises a material other than gold, the plasmonic material has a planar equivalent thickness of at least 10 nm.

8. The article of claim 7, wherein the plasmonic material is a plasmonic material in at least one wavelength in the ultraviolet, visible, or infrared wavelength range.

9. The article of claim 7 further comprising a dielectric layer disposed between the plurality of particles and plasmonic material.

10. The article of claim 7, wherein the two-dimensional particles have an aspect ratio of at least greater than 10:1.

11. The article of claim 7, wherein the layer of plasmonic material consists of gold, silver, copper, platinum, ruthenium, nickel, palladium, rhodium, iridium, chromium, aluminum, iron, tin, lead, zinc, a combination thereof, or an alloy thereof.

12. A kit comprising:
an article described claim 1; and
instructions to use the article for spectroscopically identifying the presence of an analyte.

13. A method of spectroscopically identifying the presence of analyte comprising:
adsorbing analyte of interest to an article described claim 1;
irradiating the adsorbed analyte with electromagnetic radiation;
obtaining at least one of an electromagnetic scattering spectrum, an electromagnetic reflection spectrum, an electromagnetic emission spectrum, or an electromagnetic absorption spectrum of the irradiated, adsorbed analyte; and
interpreting the spectrum to identify the respective an electromagnetic scattering, electromagnetic reflection, electromagnetic emission, or electromagnetic absorption characteristics of the irradiated, adsorbed analyte.

* * * * *